US010699879B2

(12) United States Patent
Tan et al.

(10) Patent No.: US 10,699,879 B2
(45) Date of Patent: Jun. 30, 2020

(54) TWO PIECE ELECTRODE ASSEMBLY WITH GAP FOR PLASMA CONTROL

(71) Applicant: Applied Materials, Inc., Santa Clara, CA (US)

(72) Inventors: Tien Fak Tan, Campbell, CA (US); Saravjeet Singh, Sunnyvale, CA (US); Dmitry Lubomirsky, Cupertino, CA (US); Tae Wan Kim, San Jose, CA (US); Kenneth D. Schatz, Los Altos, CA (US); Tae Seung Cho, San Jose, CA (US); Lok Kee Loh, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 238 days.

(21) Appl. No.: 15/955,588

(22) Filed: Apr. 17, 2018

(65) Prior Publication Data
US 2019/0318911 A1    Oct. 17, 2019

(51) Int. Cl.
*H01J 37/32* (2006.01)
*H01J 37/04* (2006.01)

(52) U.S. Cl.
CPC ........ *H01J 37/32091* (2013.01); *H01J 37/04* (2013.01)

(58) Field of Classification Search
CPC .......... H01J 37/32568; H01J 37/32091; H01J 37/04; C23C 16/455
See application file for complete search history.

(56) References Cited

U.S. PATENT DOCUMENTS

| 2,369,620 A | 2/1945 | Sullivan et al. |
| 3,401,302 A | 9/1968 | Thorpe |
| 3,451,840 A | 6/1969 | Hough |
| 3,537,474 A | 11/1970 | Rohrer |

(Continued)

FOREIGN PATENT DOCUMENTS

| CN | 1124364 A | 6/1996 |
| CN | 1847450 A | 10/2006 |

(Continued)

OTHER PUBLICATIONS

Won et al. Derwent 2006-065772; Sep. 7, 2014, 10 pages.

(Continued)

*Primary Examiner* — Yuechuan Yu
(74) *Attorney, Agent, or Firm* — Kilpatrick Townsend & Stockton LLP

(57) ABSTRACT

An apparatus for distributing plasma products includes first and second electrodes that each include planar surfaces. The first electrode forms first apertures from a first planar surface to a second planar surface; the second electrode forms second apertures from the third planar surface to the fourth planar surface. The electrodes couple through one or more adjustable couplers such that the third planar surface is disposed adjacent to the second planar surface with a gap therebetween, the gap having a gap distance. Each of the adjustable couplers has a range of adjustment. The first and second apertures are arranged such that for at least one position within the ranges of adjustment, none of the first apertures aligns with any of the second apertures to form an open straight-line path extending through both the first and second electrodes, and the gap distance is between 0.005 inch and 0.050 inch.

20 Claims, 19 Drawing Sheets

(56) References Cited

U.S. PATENT DOCUMENTS

| | | |
|---|---|---|
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,503,807 A | 3/1985 | Nakayama et al. |
| 4,565,601 A | 1/1986 | Kakehi et al. |
| 4,579,618 A | 4/1986 | Celestino et al. |
| 4,585,920 A | 4/1986 | Hoog et al. |
| 4,600,464 A | 7/1986 | Desliets et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,987,856 A | 1/1991 | Hey et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,074,456 A | 12/1991 | Degner et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchalkit et al. |
| 5,215,787 A | 6/1993 | Homma |
| 5,217,559 A | 6/1993 | Moslehi et al. |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Wolgang |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,169 A | 9/1995 | Corbett, III et al. |
| 5,451,259 A | 9/1995 | Krogh |
| 5,454,170 A | 10/1995 | Cook |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |

(56) References Cited

U.S. PATENT DOCUMENTS

| | | |
|---|---|---|
| 5,549,780 A | 8/1996 | Koinuma et al. |
| 5,556,521 A | 9/1996 | Ghanbari |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,385 A | 12/1996 | Paranjpe et al. |
| 5,580,421 A | 12/1996 | Hiatt et al. |
| 5,591,269 A | 1/1997 | Arami et al. |
| 5,592,358 A | 1/1997 | Shamouilian |
| 5,595,606 A | 1/1997 | Fujikawa et al. |
| 5,597,439 A | 1/1997 | Salzman |
| 5,599,740 A | 2/1997 | Jang et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A | 2/1999 | Nowak |
| 5,866,483 A | 2/1999 | Shiau et al. |
| 5,868,897 A | 2/1999 | Ohkawa |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,928,528 A | 7/1999 | Kubota et al. |
| 5,932,077 A | 8/1999 | Reynolds |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,963,840 A | 10/1999 | Xia et al. |
| 5,968,379 A | 10/1999 | Zhao et al. |
| 5,968,587 A | 10/1999 | Frankel et al. |
| 5,968,610 A | 10/1999 | Liu et al. |
| 5,969,422 A | 10/1999 | Ting et al. |
| 5,976,327 A | 11/1999 | Tanaka |
| 5,982,100 A | 11/1999 | Ghanbari |
| 5,990,000 A | 11/1999 | Hong et al. |
| 5,990,013 A | 11/1999 | Berenguer et al. |
| 5,993,916 A | 11/1999 | Zhao et al. |
| 5,994,209 A | 11/1999 | Yieh et al. |
| 5,997,649 A | 12/1999 | Hillman |
| 5,997,721 A | 12/1999 | Limbach et al. |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,019,848 A | 2/2000 | Kiyama et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,834 A | 3/2000 | Tanaka et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |

(56) References Cited

U.S. PATENT DOCUMENTS

| | | |
|---|---|---|
| 6,065,424 A | 5/2000 | Shacham-Diamand et al. |
| 6,065,425 A | 5/2000 | Takaki et al. |
| 6,072,147 A | 6/2000 | Koshiishi |
| 6,072,227 A | 6/2000 | Yau et al. |
| 6,074,512 A | 6/2000 | Collins et al. |
| 6,074,514 A | 6/2000 | Bjorkman et al. |
| 6,077,384 A | 6/2000 | Collins et al. |
| 6,077,386 A | 6/2000 | Smith, Jr. et al. |
| 6,077,780 A | 6/2000 | Dubin |
| 6,079,356 A | 6/2000 | Umotoy et al. |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,124,003 A | 9/2000 | Mikami et al. |
| 6,126,753 A | 10/2000 | Shinriki et al. |
| 6,132,512 A | 10/2000 | Horie et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,370 A | 12/2000 | Hackett et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,170,429 B1 | 1/2001 | Schoepp |
| 6,171,661 B1 | 1/2001 | Zheng et al. |
| 6,174,450 B1 | 1/2001 | Patrick et al. |
| 6,174,810 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,184,489 B1 | 2/2001 | Ito et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,200,412 B1 | 3/2001 | Kilgore et al. |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,242,360 B1 | 6/2001 | Fischer et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,074 B1 | 7/2001 | Okumura |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,291,282 B1 | 9/2001 | Wilk et al. |
| 6,291,348 B1 | 9/2001 | Lopatin et al. |
| 6,302,964 B1 | 10/2001 | Umotoy et al. |
| 6,303,044 B1 | 10/2001 | Koemtzopoulos |
| 6,303,418 B1 | 10/2001 | Cha et al. |
| 6,306,246 B1 | 10/2001 | Melvin et al. |
| 6,306,772 B1 | 10/2001 | Lin |
| 6,308,654 B1 | 10/2001 | Schneider et al. |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |

(56) References Cited

U.S. PATENT DOCUMENTS

| | | |
|---|---|---|
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,437,512 B1 | 8/2002 | Chen et al. |
| 6,440,863 B1 | 8/2002 | Tsai et al. |
| 6,441,492 B1 | 8/2002 | Cunningham |
| 6,444,083 B1 | 9/2002 | Steger et al. |
| 6,446,572 B1 | 9/2002 | Brcka |
| 6,447,636 B1 | 9/2002 | Qian et al. |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,069 B1 | 3/2003 | Srivastava et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,673,200 B1 | 1/2004 | Gu et al. |
| 6,677,242 B1 | 1/2004 | Liu et al. |
| 6,679,981 B1 | 1/2004 | Pan et al. |
| 6,688,375 B1 | 2/2004 | Turner |
| 6,692,903 B2 | 2/2004 | Chen et al. |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,818,561 B1 | 11/2004 | Sonderman |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,401 B2 | 1/2005 | Wijenberg et al. |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,972,840 B1 | 12/2005 | Gu et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,049,244 B2 | 5/2006 | Becker et al. |
| 7,052,553 B1 | 5/2006 | Shih et al. |

(56) References Cited

U.S. PATENT DOCUMENTS

| | | |
|---|---|---|
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,297,894 B1 | 11/2007 | Tsukamoto |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,504,040 B2 | 3/2009 | Lijima et al. |
| 7,513,214 B2 | 4/2009 | Okumura et al. |
| 7,520,957 B2 | 4/2009 | Kao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,906,818 B2 | 3/2011 | Pekny |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,977,249 B1 | 7/2011 | Liu |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,199,454 B2 | 6/2012 | Koyama et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,298,959 B2 | 10/2012 | Cheshire |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,343,306 B2 | 1/2013 | Tanaka et al. |
| 8,357,435 B2 | 1/2013 | Lubomirsky |
| 8,361,892 B2 | 1/2013 | Tam et al. |
| 8,368,308 B2 | 2/2013 | Banna et al. |
| 8,390,980 B2 | 3/2013 | Sansoni et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,354 B2 | 3/2014 | O'Hara |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,610 B2 | 6/2014 | Chen et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,835,316 B2 | 9/2014 | Yin et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,894,767 B2 | 11/2014 | Goradia et al. |
| 8,895,449 B1 | 11/2014 | Zhu et al. |

(56) References Cited

U.S. PATENT DOCUMENTS

| | | |
|---|---|---|
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,937,017 B2 | 1/2015 | Cheshire et al. |
| 8,945,414 B1 | 2/2015 | Su et al. |
| 8,946,665 B2 | 2/2015 | Shim et al. |
| 8,946,828 B2 | 2/2015 | Sun et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,068,265 B2 | 6/2015 | Lubomirsky et al. |
| 9,072,158 B2 | 6/2015 | Ikeda et al. |
| 9,093,371 B2 | 7/2015 | Wang et al. |
| 9,093,389 B2 | 7/2015 | Nemani |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,267,739 B2 | 2/2016 | Chen et al. |
| 9,269,590 B2 | 2/2016 | Luere et al. |
| 9,275,834 B1 | 3/2016 | Park et al. |
| 9,281,384 B2 | 3/2016 | Takeguchi |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,539 B2 | 3/2016 | Makhratchev |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,362,163 B2 | 6/2016 | Danek et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,961 B2 | 7/2016 | Arghavani et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,412,752 B1 | 8/2016 | Yeh et al. |
| 9,418,858 B2 | 8/2016 | Wang et al. |
| 9,425,041 B2 | 8/2016 | Berry et al. |
| 9,425,057 B2 | 8/2016 | Cho et al. |
| 9,425,058 B2 | 8/2016 | Kim et al. |
| 9,431,268 B2 | 8/2016 | Lill et al. |
| 9,431,414 B2 | 8/2016 | Jang et al. |
| 9,343,358 B1 | 9/2016 | Montgomery |
| 9,437,451 B2 | 9/2016 | Chen et al. |
| 9,443,749 B2 | 9/2016 | Smith |
| 9,449,843 B1 | 9/2016 | Korolik et al. |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,433 B1 | 10/2016 | Zhou et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,534,724 B2 | 1/2017 | Jiang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,788 B2 | 2/2017 | Liu et al. |
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,791 B2 | 5/2017 | Wang et al. |
| 9,659,792 B2 | 5/2017 | Wang et al. |
| 9,666,449 B2 | 5/2017 | Koval et al. |
| 9,691,645 B2 | 6/2017 | Benjaminson et al. |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,779,956 B1 | 10/2017 | Zhang et al. |
| 9,812,462 B1 | 11/2017 | Pang et al. |
| 9,822,009 B2 | 11/2017 | Kagaya et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,934,942 B1 | 4/2018 | Lubomirsky |
| 9,941,097 B2 | 4/2018 | Yamazawa |

(56) References Cited

U.S. PATENT DOCUMENTS

| | | |
|---|---|---|
| 9,947,549 B1 | 4/2018 | Park et al. |
| 9,960,045 B1 | 5/2018 | Purayath et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,043,674 B1 | 8/2018 | Korolik et al. |
| 10,043,684 B1 | 8/2018 | Arnepalli et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 | 8/2018 | Lubomirsky |
| 10,062,587 B2 | 8/2018 | Chen et al. |
| 10,083,830 B2 | 9/2018 | Seino et al. |
| 10,147,620 B2 | 12/2018 | Benjaminson et al. |
| 10,147,736 B2 | 12/2018 | Linuma |
| 10,269,541 B2 | 4/2019 | Stowell et al. |
| 10,319,739 B2 | 6/2019 | Purayath |
| 2001/0003014 A1 | 6/2001 | Yuda |
| 2001/0006093 A1 | 7/2001 | Tabuchi et al. |
| 2001/0008803 A1 | 7/2001 | Takamatsu et al. |
| 2001/0015175 A1 | 8/2001 | Masuda et al. |
| 2001/0015261 A1 | 8/2001 | Kobayashi et al. |
| 2001/0023741 A1 | 9/2001 | Collison et al. |
| 2001/0028093 A1 | 10/2001 | Yamazaki et al. |
| 2001/0028922 A1 | 10/2001 | Sandhu |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0042512 A1 | 11/2001 | Xu et al. |
| 2001/0042799 A1 | 11/2001 | Kim et al. |
| 2001/0045269 A1 | 11/2001 | Yamada |
| 2001/0047760 A1 | 12/2001 | Moslehi |
| 2001/0053585 A1 | 12/2001 | Kikuchi et al. |
| 2001/0053610 A1 | 12/2001 | Athavale et al. |
| 2001/0054381 A1 | 12/2001 | Umotoy et al. |
| 2001/0054387 A1 | 12/2001 | Frankel et al. |
| 2002/0000202 A1 | 1/2002 | Yuda et al. |
| 2002/0001778 A1 | 1/2002 | Latchford et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0020429 A1 | 2/2002 | Selbrede et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi et al. |
| 2002/0042192 A1 | 4/2002 | Tanaka et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0048963 A1 | 4/2002 | Campbell et al. |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0073925 A1 | 6/2002 | Noble et al. |
| 2002/0074573 A1 | 6/2002 | Takeuchi et al. |
| 2002/0075624 A1 | 6/2002 | Wang et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell et al. |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0185226 A1 | 12/2002 | Lea et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0000647 A1 | 1/2003 | Yudovsky et al. |
| 2003/0003757 A1 | 1/2003 | Naltan et al. |
| 2003/0007910 A1 | 1/2003 | Lazarovich et al. |
| 2003/0010645 A1 | 1/2003 | Ting et al. |
| 2003/0015515 A1 | 1/2003 | Ito et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink et al. |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0101938 A1 | 6/2003 | Ronsse et al. |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0119328 A1 | 6/2003 | Fujisato |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |

(56) References Cited

U.S. PATENT DOCUMENTS

| | | |
|---|---|---|
| 2003/0196760 A1 | 10/2003 | Tyler et al. |
| 2003/0199170 A1 | 10/2003 | Li |
| 2003/0200929 A1 | 10/2003 | Otsuki |
| 2003/0201764 A1 | 10/2003 | Jafari et al. |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0002221 A1 | 1/2004 | O'Donnell et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0115947 A1 | 6/2004 | Fink et al. |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149387 A1 | 8/2004 | Kim et al. |
| 2004/0149394 A1 | 8/2004 | Doan et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0163601 A1 | 8/2004 | Kadotani et al. |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0238123 A1 | 12/2004 | Becknell et al. |
| 2004/0259367 A1 | 12/2004 | Constantine et al. |
| 2004/0263827 A1 | 12/2004 | Xu |
| 2005/0000430 A1 | 1/2005 | Jang et al. |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0217582 A1 | 10/2005 | Kim et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0241579 A1 | 11/2005 | Kidd |
| 2005/0241583 A1 | 11/2005 | Buechel et al. |
| 2005/0241763 A1 | 11/2005 | Huang et al. |
| 2005/0251990 A1 | 11/2005 | Choi et al. |
| 2005/0257890 A1 | 11/2005 | Park et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |

(56) References Cited

U.S. PATENT DOCUMENTS

| | | |
|---|---|---|
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0032833 A1 | 2/2006 | Kawaguchi et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0054280 A1 | 3/2006 | Jang |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0151115 A1 | 7/2006 | Kim et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210713 A1 | 9/2006 | Brcka |
| 2006/0210723 A1 | 9/2006 | Ishizaka |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0245852 A1 | 11/2006 | Iwabuchi |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0285270 A1 | 12/2006 | Lee |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0022952 A1 | 2/2007 | Ritchie et al. |
| 2007/0022954 A1 | 2/2007 | Ilzuka et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0128876 A1 | 6/2007 | Fukiage |
| 2007/0131274 A1 | 6/2007 | Stollwerck et al. |
| 2007/0145023 A1 | 6/2007 | Holber et al. |
| 2007/0148349 A1 | 6/2007 | Fukada |
| 2007/0154838 A1 | 7/2007 | Lee |
| 2007/0163440 A1 | 7/2007 | Kim et al. |
| 2007/0169703 A1 | 7/2007 | Elliot et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Limuro |
| 2007/0235136 A1 | 10/2007 | Enomoto et al. |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0258186 A1 | 11/2007 | Matyushkin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0272154 A1 | 11/2007 | Amikura et al. |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0284044 A1 | 12/2007 | Matsumoto et al. |
| 2007/0284344 A1 | 12/2007 | Todorov et al. |
| 2007/0287292 A1 | 12/2007 | Li et al. |
| 2007/0296967 A1 | 12/2007 | Gupta et al. |
| 2008/0003836 A1 | 1/2008 | Nishimura et al. |
| 2008/0011424 A1 | 1/2008 | Yin et al. |
| 2008/0017104 A1 | 1/2008 | Matyushkin et al. |
| 2008/0020570 A1 | 1/2008 | Naik |
| 2008/0029032 A1 | 2/2008 | Sun et al. |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0089001 A1 | 4/2008 | Parkhe et al. |
| 2008/0099147 A1 | 5/2008 | Myo et al. |
| 2008/0099431 A1 | 5/2008 | Kumar et al. |
| 2008/0099876 A1 | 5/2008 | Seto |

(56) References Cited

U.S. PATENT DOCUMENTS

| | | |
|---|---|---|
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0141941 A1 | 6/2008 | Augustino et al. |
| 2008/0142831 A1 | 6/2008 | Su |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0193673 A1 | 8/2008 | Paterson et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0317965 A1 | 12/2008 | Son et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0022633 A1 | 1/2009 | Tomosue et al. |
| 2009/0036292 A1 | 2/2009 | Sun et al. |
| 2009/0045167 A1 | 2/2009 | Maruyama |
| 2009/0061640 A1 | 3/2009 | Wong et al. |
| 2009/0072401 A1 | 3/2009 | Arnold et al. |
| 2009/0075409 A1 | 3/2009 | Ueno et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram et al. |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120364 A1 | 5/2009 | Suarez et al. |
| 2009/0120464 A1 | 5/2009 | Rasheed et al. |
| 2009/0120582 A1 | 5/2009 | Koshimizu |
| 2009/0140738 A1 | 6/2009 | Desvaux et al. |
| 2009/0159213 A1 | 6/2009 | Bera et al. |
| 2009/0159566 A1 | 6/2009 | Brillhart et al. |
| 2009/0159588 A1 | 6/2009 | Morioka et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0212804 A1 | 8/2009 | Yamada et al. |
| 2009/0214825 A1 | 8/2009 | Sun et al. |
| 2009/0223928 A1 | 9/2009 | Colpo |
| 2009/0226633 A1 | 9/2009 | Laflamme, Jr. et al. |
| 2009/0236314 A1 | 9/2009 | Chen |
| 2009/0253222 A1 | 10/2009 | Morisawa et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0286405 A1 | 11/2009 | Okesaku et al. |
| 2009/0293809 A1 | 12/2009 | Cho et al. |
| 2009/0294898 A1 | 12/2009 | Feustel et al. |
| 2009/0298256 A1 | 12/2009 | Chen et al. |
| 2009/0302005 A1 | 12/2009 | Kool et al. |
| 2009/0314309 A1 | 12/2009 | Sankarakrishnan et al. |
| 2009/0314433 A1 | 12/2009 | Hoffman et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003406 A1 | 1/2010 | Lam et al. |
| 2010/0003824 A1 | 1/2010 | Kadkhodayan et al. |
| 2010/0006032 A1 | 1/2010 | Hinckley et al. |
| 2010/0006543 A1 | 1/2010 | Sawada et al. |
| 2010/0018648 A1 | 1/2010 | Collins et al. |
| 2010/0022030 A1 | 1/2010 | Ditizio |
| 2010/0025370 A1 | 2/2010 | Dieguez-Campo et al. |
| 2010/0037821 A1 | 2/2010 | Nogami |
| 2010/0039747 A1 | 2/2010 | Sansoni |
| 2010/0047080 A1 | 2/2010 | Bruce |
| 2010/0048022 A1 | 2/2010 | Kubota |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0072172 A1 | 3/2010 | Ui et al. |
| 2010/0075503 A1 | 3/2010 | Bencher |
| 2010/0081285 A1 | 4/2010 | Chen et al. |
| 2010/0089533 A1 | 4/2010 | Ueda et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0098882 A1 | 4/2010 | Lubomirsky et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |

(56) References Cited

U.S. PATENT DOCUMENTS

| | | |
|---|---|---|
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0206483 A1 | 8/2010 | Sorensen et al. |
| 2010/0207195 A1 | 8/2010 | Fukuzumi et al. |
| 2010/0207205 A1 | 8/2010 | Grebs et al. |
| 2010/0212594 A1 | 8/2010 | Hara et al. |
| 2010/0213172 A1 | 8/2010 | Wilson |
| 2010/0224322 A1 | 9/2010 | Sui et al. |
| 2010/0224324 A1 | 9/2010 | Kasai |
| 2010/0240205 A1 | 9/2010 | Son |
| 2010/0243165 A1 | 9/2010 | Um |
| 2010/0243606 A1 | 9/2010 | Koshimizu |
| 2010/0244204 A1 | 9/2010 | Matsuoka et al. |
| 2010/0248488 A1 | 9/2010 | Agarwal et al. |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0314005 A1 | 12/2010 | Saito et al. |
| 2010/0317197 A1 | 12/2010 | Lind et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0043228 A1 | 2/2011 | Makhratchev et al. |
| 2011/0045676 A1 | 2/2011 | Park |
| 2011/0048325 A1 | 3/2011 | Choi et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0088847 A1 | 4/2011 | Law et al. |
| 2011/0100489 A1 | 5/2011 | Orito |
| 2011/0101335 A1 | 5/2011 | Yamazaki et al. |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shih et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0223334 A1 | 9/2011 | Yudovsky et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0256421 A1 | 10/2011 | Bose et al. |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0303146 A1 | 12/2011 | Nishijima |
| 2011/0304078 A1 | 12/2011 | Lee et al. |
| 2011/0308453 A1 | 12/2011 | Su et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0073501 A1 | 3/2012 | Lubomirsky et al. |
| 2012/0091108 A1 | 4/2012 | Lin Xing et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122302 A1 | 5/2012 | Weidman et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |

(56) References Cited

U.S. PATENT DOCUMENTS

| | | |
|---|---|---|
| 2012/0247677 A1 | 10/2012 | Himori et al. |
| 2012/0255491 A1 | 10/2012 | Hahidi |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0309204 A1 | 12/2012 | Kang et al. |
| 2012/0309205 A1 | 12/2012 | Wang et al. |
| 2012/0322015 A1 | 12/2012 | Kim |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023062 A1 | 1/2013 | Masuda et al. |
| 2013/0023094 A1 | 1/2013 | Yeh et al. |
| 2013/0023124 A1 | 1/2013 | Nemani et al. |
| 2013/0023125 A1 | 1/2013 | Singh |
| 2013/0026135 A1 | 1/2013 | Kim |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0049592 A1 | 2/2013 | Yeom et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0059448 A1 | 3/2013 | Marakhtanov et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0095646 A1 | 4/2013 | Alsmeier et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0107415 A1 | 5/2013 | Banna et al. |
| 2013/0112383 A1 | 5/2013 | Hanamachi |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0133578 A1 | 5/2013 | Hwang |
| 2013/0149866 A1 | 6/2013 | Shriner |
| 2013/0150303 A1 | 6/2013 | Kungl et al. |
| 2013/0152859 A1 | 6/2013 | Collins et al. |
| 2013/0155568 A1 | 6/2013 | Todorow et al. |
| 2013/0161726 A1 | 6/2013 | Kim et al. |
| 2013/0171810 A1 | 7/2013 | Sun et al. |
| 2013/0171827 A1 | 7/2013 | Cho et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224953 A1 | 8/2013 | Salinas et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0276983 A1 | 10/2013 | Park et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0284700 A1 | 10/2013 | Nangoy et al. |
| 2013/0286530 A1 | 10/2013 | Lin et al. |
| 2013/0295297 A1 | 11/2013 | Chou et al. |
| 2013/0298942 A1 | 11/2013 | Ren et al. |
| 2013/0302980 A1 | 11/2013 | Chandrashekar et al. |
| 2013/0320550 A1 | 12/2013 | Kim |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0053866 A1 | 2/2014 | Baluja et al. |
| 2014/0054269 A1 | 2/2014 | Hudson et al. |
| 2014/0057447 A1 | 2/2014 | Yang et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0076234 A1 | 3/2014 | Kao et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0110061 A1 | 4/2014 | Okunishi |
| 2014/0124364 A1 | 5/2014 | Yoo et al. |
| 2014/0134842 A1 | 5/2014 | Zhange et al. |
| 2014/0134847 A1 | 5/2014 | Seya |
| 2014/0141621 A1 | 5/2014 | Ren et al. |
| 2014/0147126 A1 | 5/2014 | Yamashita et al. |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen et al. |
| 2014/0166618 A1 | 6/2014 | Tadigadapa et al. |
| 2014/0175530 A1 | 6/2014 | Chien et al. |
| 2014/0175534 A1 | 6/2014 | Kofuji et al. |
| 2014/0186772 A1 | 7/2014 | Pohlers et al. |
| 2014/0190410 A1 | 7/2014 | Kim |
| 2014/0190632 A1 | 7/2014 | Kumar et al. |
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0216337 A1 | 8/2014 | Swaminathan et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0251956 A1 | 9/2014 | Jeon et al. |
| 2014/0253900 A1 | 9/2014 | Cornelissen et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263272 A1 | 9/2014 | Duan et al. |
| 2014/0264507 A1 | 9/2014 | Lee et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |

(56) References Cited

U.S. PATENT DOCUMENTS

| | | |
|---|---|---|
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363977 A1 | 12/2014 | Morimoto et al. |
| 2014/0363979 A1 | 12/2014 | Or et al. |
| 2014/0373782 A1 | 12/2014 | Park et al. |
| 2015/0007770 A1 | 1/2015 | Chandrasekharan et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0050812 A1 | 2/2015 | Smith |
| 2015/0056814 A1 | 2/2015 | Ling et al. |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118822 A1 | 4/2015 | Zhang et al. |
| 2015/0118858 A1 | 4/2015 | Takaba |
| 2015/0123541 A1 | 5/2015 | Baek et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0140827 A1 | 5/2015 | Kao et al. |
| 2015/0152072 A1 | 6/2015 | Cantat et al. |
| 2015/0155177 A1 | 6/2015 | Zhang et al. |
| 2015/0167705 A1 | 6/2015 | Lee et al. |
| 2015/0170811 A1 | 6/2015 | Tanigawa et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0187625 A1 | 7/2015 | Busche et al. |
| 2015/0191823 A1 | 7/2015 | Banna et al. |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214101 A1 | 7/2015 | Ren et al. |
| 2015/0214337 A1 | 7/2015 | Ko et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0240359 A1 | 8/2015 | Jdira et al. |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0270105 A1 | 9/2015 | Kobayashi et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0303031 A1 | 10/2015 | Choi |
| 2015/0332930 A1 | 11/2015 | Wang et al. |
| 2015/0332953 A1 | 11/2015 | Futase et al. |
| 2015/0340225 A1 | 11/2015 | Kim et al. |
| 2015/0340371 A1 | 11/2015 | Lue |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0371877 A1 | 12/2015 | Lin et al. |
| 2015/0376782 A1 | 12/2015 | Griffin et al. |
| 2015/0380419 A1 | 12/2015 | Gunji-Yoneoka et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042920 A1 | 2/2016 | Cho et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0056235 A1 | 2/2016 | Lee et al. |
| 2016/0064212 A1 | 3/2016 | Thedjoisworo et al. |
| 2016/0064233 A1 | 3/2016 | Wang et al. |
| 2016/0079062 A1 | 3/2016 | Zheng et al. |
| 2016/0079072 A1 | 3/2016 | Wang et al. |
| 2016/0083844 A1 | 3/2016 | Nishitani et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0099173 A1 | 4/2016 | Agarwal et al. |
| 2016/0104606 A1 | 4/2016 | Park et al. |
| 2016/0104648 A1 | 4/2016 | Park et al. |
| 2016/0109863 A1 | 4/2016 | Valcore et al. |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0190147 A1 | 6/2016 | Kato et al. |
| 2016/0196969 A1 | 7/2016 | Berry et al. |
| 2016/0196984 A1 | 7/2016 | Lill et al. |
| 2016/0196985 A1 | 7/2016 | Tan et al. |
| 2016/0203958 A1 | 7/2016 | Arase et al. |
| 2016/0204009 A1 | 7/2016 | Nguyen et al. |
| 2016/0208395 A1 | 7/2016 | Ooshima |
| 2016/0218018 A1 | 7/2016 | Lieu et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240353 A1 | 8/2016 | Nagami |

(56) References Cited

U.S. PATENT DOCUMENTS

| | | |
|---|---|---|
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293398 A1 | 10/2016 | Danek et al. |
| 2016/0293438 A1 | 10/2016 | Zhou et al. |
| 2016/0300694 A1 | 10/2016 | Yang et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0340781 A1 | 11/2016 | Thomas et al. |
| 2016/0343548 A1 | 11/2016 | Howald et al. |
| 2016/0358793 A1 | 12/2016 | Okumara et al. |
| 2017/0011922 A1 | 1/2017 | Tanimura et al. |
| 2017/0040175 A1 | 2/2017 | Xu et al. |
| 2017/0040180 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0053808 A1 | 2/2017 | Kamp et al. |
| 2017/0062184 A1 | 3/2017 | Tran et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0121818 A1 | 5/2017 | Dunn et al. |
| 2017/0133202 A1 | 5/2017 | Berry |
| 2017/0169995 A1 | 6/2017 | Kim et al. |
| 2017/0178894 A1 | 6/2017 | Stone et al. |
| 2017/0178899 A1 | 6/2017 | Kabansky et al. |
| 2017/0178924 A1 | 6/2017 | Chen et al. |
| 2017/0194128 A1 | 7/2017 | Lai et al. |
| 2017/0207088 A1 | 7/2017 | Kwon et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |
| 2017/0236694 A1 | 8/2017 | Eason et al. |
| 2017/0250193 A1 | 8/2017 | Huo |
| 2017/0294445 A1 | 10/2017 | Son et al. |
| 2017/0306494 A1 | 10/2017 | Lin et al. |
| 2017/0309509 A1 | 10/2017 | Tran et al. |
| 2017/0316935 A1 | 11/2017 | Tan et al. |
| 2017/0338133 A1 | 11/2017 | Tan et al. |
| 2017/0338134 A1 | 11/2017 | Tan et al. |
| 2017/0350011 A1 | 12/2017 | Marquardt |
| 2017/0373082 A1 | 12/2017 | Sekine et al. |
| 2018/0005850 A1 | 1/2018 | Citla et al. |
| 2018/0006050 A1 | 1/2018 | Watanabe et al. |
| 2018/0025900 A1 | 1/2018 | Park et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076083 A1 | 3/2018 | Ko et al. |
| 2018/0080124 A1 | 3/2018 | Bajaj et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0223437 A1 | 8/2018 | George et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0240654 A1 | 8/2018 | Park et al. |
| 2018/0261516 A1 | 9/2018 | Lin et al. |
| 2018/0261686 A1 | 9/2018 | Lin et al. |
| 2018/0366351 A1 | 12/2018 | Lubomirsky |

FOREIGN PATENT DOCUMENTS

| | | |
|---|---|---|
| CN | 101236893 A | 8/2008 |
| CN | 101378850 A | 3/2009 |
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-264510 A | 10/1996 |
| JP | H09-260356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-2000-008278 A | 2/2000 |
| KR | 10-2000-0064946 A | 11/2000 |
| KR | 10-2001-0056735 A | 7/2001 |
| KR | 2003-0023964 A | 3/2003 |
| KR | 10-2003-0054726 A | 7/2003 |
| KR | 10-2003-0083663 A | 10/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 10-2006-0127173 A | 12/2006 |
| KR | 100663668 B1 | 1/2007 |
| KR | 100678696 B1 | 1/2007 |
| KR | 100712727 B1 | 4/2007 |
| KR | 2007-0079870 A | 8/2007 |
| KR | 10-2008-0063988 A | 7/2008 |
| KR | 10-0843236 B1 | 7/2008 |

(56) References Cited

FOREIGN PATENT DOCUMENTS

| | | |
|---|---|---|
| KR | 10-2009-0040869 A | 4/2009 |
| KR | 10-2009-0128913 A | 12/2009 |
| KR | 10-2010-0013980 A | 2/2010 |
| KR | 10-2010-0093358 A | 8/2010 |
| KR | 10-2011-0086540 A | 7/2011 |
| KR | 10-2011-0114538 A | 10/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 565903 B | 12/2003 |
| TW | 2006-12480 A | 4/2006 |
| TW | M299917 U | 10/2006 |
| TW | 200709256 A | 3/2007 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| TW | 2016-08935 A | 3/2016 |
| TW | I609442 B | 12/2017 |
| TW | 2018-14787 A | 4/2018 |
| WO | 2008-112673 A2 | 9/2008 |
| WO | 2009-009611 A2 | 1/2009 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011070945 A1 | 6/2011 |
| WO | 2011-095846 A | 8/2011 |
| WO | 2011-149638 A | 12/2011 |
| WO | 2012-050321 A | 7/2012 |
| WO | 2012-118987 A1 | 9/2012 |
| WO | 2012-125656 A2 | 9/2012 |
| WO | 2012-148568 A1 | 11/2012 |
| WO | 2013-118260 A1 | 8/2013 |

OTHER PUBLICATIONS

H. Xiao, Introduction to Semiconductor Manufacturing Technology, published by Prentice Hall, 2001, ISBN 0-13-022404-9, pp. 354-356.

Manual No. TQMA72E1. "Bayard-Alpert Pirani Gauge FRG-730: Short Operating Instructions" Mar. 2012. Agilent Technologies, Lexington, MA 02421, USA. pp. 1-45.

International Search Report and Written Opinion of PCT/US2016/045551 dated Nov. 17, 2016, all pages.

International Search Report and Written Opinion of PCT/US2016/045543 dated Nov. 17, 2016, all pages.

"Liang et al. Industrial Application of Plasma Process vol. 3, pp. 61-74, 2010".

Instrument Manual: Vacuum Gauge Model MM200, Rev D. TELEVAC (website: www.televac.com), A Division of the Fredericks Company, Huntingdon Valley, PA, US. 2008. pp. 162.

J.J. Wang and et al., "Inductively coupled plasma etching of bulk 1-20 6H-SiC and thin-film SiCN in NF3 chemistries," Journal of Vacuum Science & Technology A: Vacuum, Surfaces, and Films 16, 2204 (1998).

International Search Report and Written Opinion of PCT/US2017/047209 dated Nov. 24, 2017, all pages.

International Search Report and Written Opinion of PCT/US2017/033362 dated Aug. 24, 2017, all pages.

International Search Report and Written Opinion of PCT/US2017/060696 dated Jan. 25, 2018, all pages.

International Search Report and Written Opinion of PCT/US2017/055431 dated Jan. 19, 2018, all pages.

International Search Report and Written Opinion of PCT/US2018/016261 dated May 21, 2018, all pages.

International Search Report and Written Opinion of PCT/US2018/016648 dated May 18, 2018, all pages.

TWO PIECE ELECTRODE ASSEMBLY WITH GAP FOR PLASMA CONTROL

TECHNICAL FIELD

The present disclosure relates to plasma processing systems.

BACKGROUND

In plasma processing, plasmas create species such as radicals, excited molecular species, molecular fragments, individual atoms and/or free electrons from a source gas. Mixtures of such species, with or without untransformed portions of the source gas, and with or without further gases mixed in, are called "plasma products" herein. Plasma processing brings plasma products into contact with workpieces that may be, for example, semiconductor wafers. To create and/or maintain a plasma, one or more radio frequency (RF) and/or microwave generators typically provide electromagnetic power to a region that contains the source gas. The plasma can be generated from the source gas in the location of one or more wafers being processed, and/or in a first, "upstream" location, after which the plasma products move to a second, "downstream" location to contact the wafer(s). Some systems generate one, two or more plasmas in different locations before the plasma products ultimately contact the wafer(s). Source gases, plasma products and/or other gases mixed with the plasma products often contain highly energetic, charged and/or corrosive species, and/or highly energetic electrons, such that the plasma equipment can sometimes degrade from contact with these materials. This can make materials and/or coatings of plasma system components critical to the longevity and maintenance requirements of the system. Wafer processing can also be affected, and therefore controlled by, the relative presence or absence of certain components of plasma products.

SUMMARY

In one or more embodiments, an apparatus for distributing plasma products includes a first electrode and a second electrode. The first electrode includes a first planar surface and a second planar surface separated by a first electrode thickness that is between 0.125 inch and 1.000 inch. The first electrode forms a plurality of first apertures extending therethrough, from the first planar surface to the second planar surface. The second electrode includes a third planar surface and a fourth planar surface separated by a second electrode thickness that is between 0.125 inch and 1.000 inch. The second electrode forms a plurality of second apertures extending therethrough, from the third planar surface to the fourth planar surface. The second electrode couples with the first electrode through one or more adjustable couplers such that the third planar surface is disposed adjacent to the second planar surface with a gap therebetween, the gap being characterized by a gap distance. Each of the one or more adjustable couplers has a range of adjustment. For at least a first position within the range of adjustment of each of the one or more adjustable couplers, the first and second apertures are arranged within the first and second electrodes, such that none of the first apertures aligns with any of the second apertures to form an open straight-line path extending through both the first and second electrodes, and the gap distance is between 0.005 inch and 0.050 inch.

In one or more embodiments, an apparatus for distributing plasma products includes a first electrode and a second electrode. The first electrode includes a first planar surface and a second planar surface separated by a first electrode thickness that is between 0.125 inch and 1.000 inch. The first electrode forms a plurality of first apertures extending therethrough, from the first planar surface to the second planar surface. The second electrode includes a third planar surface and a fourth planar surface separated by a second electrode thickness that is between 0.125 inch and 1.000 inch. The second electrode is coupled fixedly with the first electrode such that the third planar surface is disposed adjacent to the second planar surface, with a gap distance of 0.005 inches to 0.050 inches therebetween. The first and second apertures are arranged within the first and second electrodes such that none of the first apertures aligns with any of the second apertures to form an open straight-line path extending through both the first and second electrodes.

In one or more embodiments, a plasma source includes a plasma generation region configured for introduction of one or more source gases therein, an RF power supply that provides electromagnetic power to the one or more source gases to ignite a plasma within the plasma generation region, and a two piece electrode assembly that bounds the plasma generation region on one side. The two piece electrode assembly includes a first electrode that defines a first planar surface and a second planar surface. The first planar surface and the second planar surface are separated by a first electrode thickness that is between 0.100 inch and 1.000 inch, and the first electrode forms a plurality of first apertures extending therethrough, from the first planar surface to the second planar surface. The two piece electrode assembly also includes a second electrode that defines a third planar surface and a fourth planar surface. The third planar surface and the fourth planar surface separated by a second electrode thickness that is between 0.100 inch and 1.000 inch, and the second electrode forms a plurality of second apertures extending therethrough, from the third planar surface to the fourth planar surface. The first electrode and the second electrode are fixed or positionable with respect to one another so as to provide a gap between the first electrode and the second electrode, the gap forming a gap distance of 0.005 inches to 0.050 inches between the second planar surface and the third planar surface, and a lateral separation of any point within one of the first apertures, with respect to any point within any of the second apertures, of greater than three times the gap distance. The plasma source further includes a second region that is bounded on at least one side by the fourth planar surface of the second electrode, wherein the gap and the lateral separation cooperate to substantially reduce transmission of free electrons and ionized species from the plasma generation region to the second region.

In one or more embodiments, a method for providing plasma products includes converting at least a portion of a source gas to plasma products, by providing electromagnetic power to the source gas within a plasma generation chamber to generate a plasma, and passing at least a portion of the plasma products through a two piece electrode assembly. The two piece electrode assembly includes a first electrode and a second electrode. The first electrode defines a plurality of first apertures therethrough, a first side of the first electrode facing the plasma such that the portion of the plasma products passes through the plurality of first apertures to a second planar side of the first planar electrode. The second electrode defines a plurality of second apertures therethrough, a third planar side of the second electrode being disposed facing the second side of the first electrode.

The second electrode is coupled with the first electrode such that the third planar surface is disposed adjacent to the second planar surface, with a gap distance therebetween. The first and second apertures are arranged within the first and second electrodes such that none of the first apertures aligns with any of the second apertures to form an open straight-line path extending through both the first and second electrodes. The gap distance is sufficient to allow neutral species of the plasma products to pass through the gap as the first portion of the plasma products, but is sufficiently small to cause ionized species of the plasma products to interact with the first or second electrodes and not to pass through the two piece electrode assembly.

In one or more embodiments, a method for optimizing a plasma apparatus includes providing a plasma generation chamber, a downstream chamber, and a two piece electrode assembly therebetween that is operable to modify fluid communication between the plasma generation chamber and the downstream chamber. The two piece electrode assembly includes a first electrode, a second electrode and one or more actuators. The first electrode defines a plurality of first apertures therethrough, a first surface of the first electrode facing the plasma generation chamber and a second planar surface of the first electrode facing away from the plasma generation chamber. The second electrode that defines a plurality of second apertures therethrough, a third planar surface of the second electrode being disposed facing the second planar surface of the first electrode, and a fourth surface of the second electrode facing the downstream chamber. The one or more actuators couple the first and second electrodes, and are operable, in response to an electronic input, to adjust a position of the first electrode relative to a position of the second electrode. The one or more actuators can be operated to provide at least one position of the first electrode relative to the second electrode such that the third planar surface is disposed adjacent to the second planar surface, with a first gap distance between 0.005 inch and 0.050 inch therebetween, and the first and second apertures are arranged within the first and second electrodes such that none of the first apertures aligns with any of the second apertures to form an open straight-line path extending through both the first and second electrodes. The method further includes: establishing a position of the first electrode at a first position relative to the position of the second electrode; operating the plasma generation chamber so as to flow at least a portion of plasma products generated thereby, through the two piece electrode assembly and into the downstream chamber, to process a workpiece; evaluating process results on the workpiece; and operating the electronic input so as to modify the position of the first electrode to a second position relative to the position of the second electrode, in response to the process results.

In one or more embodiments, a method for optimizing a plasma apparatus includes providing a plasma generation chamber, a downstream chamber, and a two piece electrode assembly therebetween that is operable to modify fluid communication between the plasma generation chamber and the downstream chamber. The two piece electrode assembly includes a first electrode, a second electrode and an actuator. The first electrode defines a plurality of first apertures therethrough, a first surface of the first electrode facing the plasma generation chamber and a second planar surface of the first electrode facing away from the plasma generation chamber. The second electrode that defines a plurality of second apertures therethrough, a third planar surface of the second electrode being disposed facing the second planar surface of the first electrode, and a fourth surface of the second electrode facing the downstream chamber. The actuator couples with the first and second electrodes, and is operable to adjust a gap distance between the second and third planar surfaces, the actuator being characterized by a known distance response to an electronic input. The method further includes: operating the electronic input so as to bring a portion of the first electrode into contact with a portion of the second electrode; establishing the electronic input that brings the portion of the first electrode into contact with the portion of the second electrode as a zero value of the electronic input; and further operating the electronic input, relative to the zero value, so as to maintain the gap distance at a desired value, according to the known distance response, to modify the fluid communication between the plasma generation chamber and the downstream chamber.

In one or more embodiments, a method of operating a plasma apparatus includes providing a plasma generation chamber, a downstream chamber, and a two piece electrode assembly therebetween that is operable to modify fluid communication between the plasma generation chamber and the downstream chamber. The two piece electrode assembly includes a first electrode, a second electrode and one or more actuators coupled with the first and second electrodes. The one or more actuators are operable to adjust a position of the first electrode relative to the second electrode. Each of the one or more actuators is characterized by a range of adjustment. For at least one position within the ranges of adjustment of the one or more actuators, the first and second apertures are arranged within the first and second electrodes such that none of the first apertures aligns with any of the second apertures to form an open straight-line path extending through both the first and second electrodes, and the gap distance is between 0.0005 inch and 0.050 inch. The method further includes: operating the one or more actuators so as to dispose the first electrode at a first position relative to the second electrode; operating the plasma generation chamber so as to flow at least a first portion of plasma products generated thereby, through the two piece electrode assembly and into the downstream chamber; operating the one or more actuators so as to dispose the first electrode at a second position relative to the second electrode; and operating the plasma generation chamber so as to flow at least a second portion of plasma products generated thereby, through the two piece electrode assembly and into the downstream chamber. A difference between the first position and the second position causes the two piece electrode assembly to modify a proportion of ionized species to neutral species in the second portion relative to the first portion.

BRIEF DESCRIPTION OF THE DRAWINGS

The present disclosure may be understood by reference to the following detailed description taken in conjunction with the drawings briefly described below, wherein like reference numerals are used throughout the several drawings to refer to similar components. For purposes of illustrative clarity, certain elements in the drawings may not be drawn to scale. Specific instances of an item may be referred to by use of a numeral followed by a second numeral within parentheses (e.g., electrodes 326(1), 326(2) etc.) while numerals not followed by a dash refer to any such item (e.g., electrodes 326). In instances where multiple instances of an item are shown, only some of the instances may be labeled, for clarity of illustration.

In the appended figures, similar components and/or features may have the same reference label. Further, various components of the same type may be distinguished by following the reference label by a numeral that distinguishes among the similar components. If only the first reference label is used in the specification, the description is applicable to any one of the similar components having the same first reference label irrespective of the numeral. Also, several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DETAILED DESCRIPTION

Figure 1:
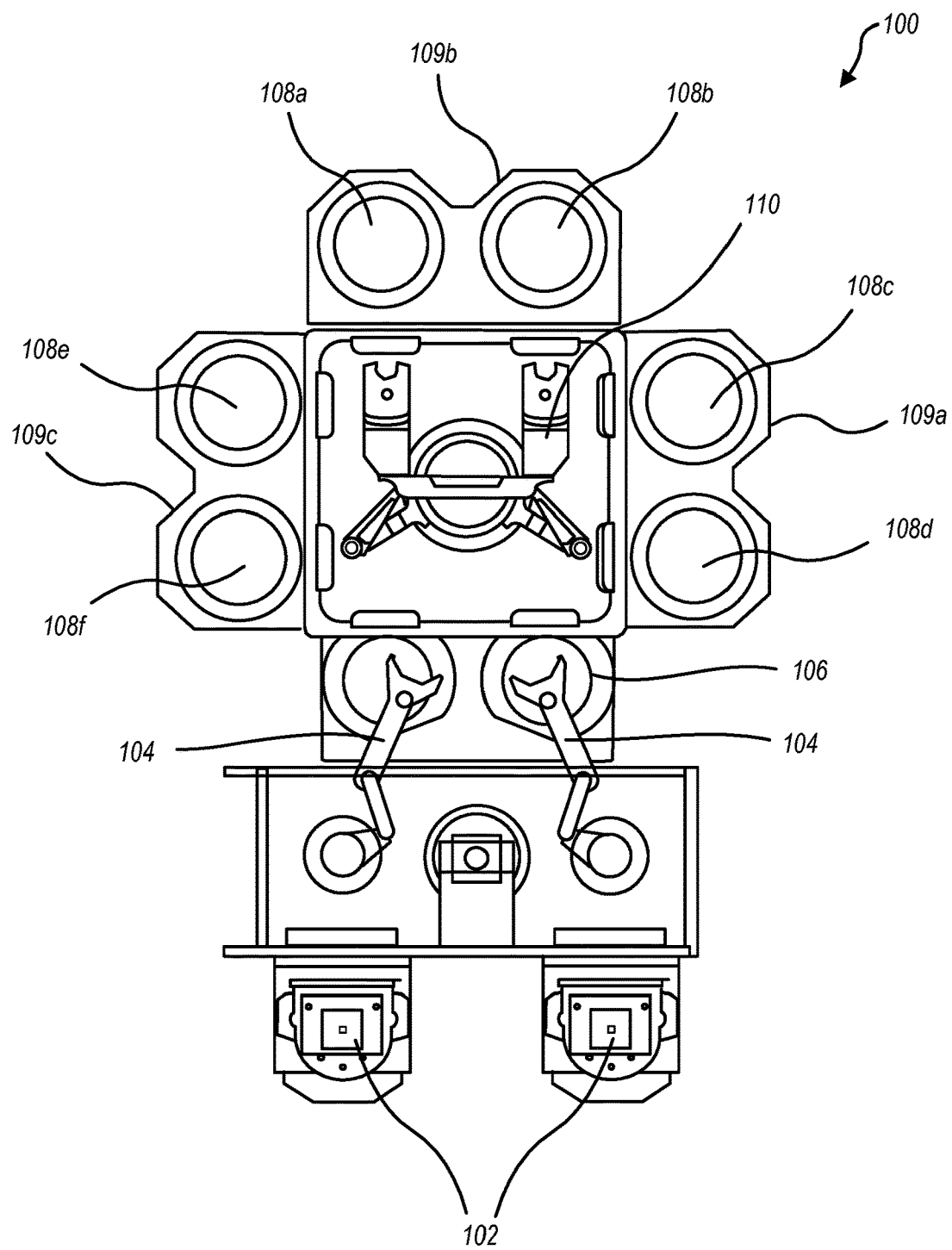
FIG. 1 schematically illustrates major elements of a plasma processing system, in a plan view, according to one or more embodiments.

FIG. 1 schematically illustrates, in a top plan view, major elements of a plasma processing system 100, that may include deposition, etching, baking, and/or curing chambers according to embodiments. System 100 is depicted as a single wafer, semiconductor wafer plasma processing system, but it will be apparent to one skilled in the art that the techniques and principles herein are applicable to plasma generation systems of any type (e.g., systems that do not necessarily process wafers or semiconductors).

In FIG. 1, a pair of front opening unified pods (FOUPs) 102 supply substrates that can be received by robotic arms 104 and placed into a low pressure holding area 106, before being placed into one of processing chambers 108a-f, positioned in tandem sections 109a-c. A second robotic arm 110 may be used to transport the substrates from the holding area 106 to the processing chambers 108a-f and back. Each processing chamber 108a-f can be outfitted to perform one or more processing operations. including dry etch processes, cyclical layer deposition (CLD), atomic layer deposition (ALD), chemical vapor deposition (CVD), physical vapor deposition (PVD), etches, pre-cleans, bakes, cures, degassing, orientation, and other processes.

Processing chambers 108a-f may include one or more system components for depositing, annealing, curing and/or etching materials on the substrates. In one configuration, two pairs of the processing chambers, e.g., 108c-d and 108e-f, may be used to deposit material(s) on the substrates, and the third pair of processing chambers, e.g., 108a-b, may be used to etch the deposited material(s) and/or the substrates. In another configuration, all three pairs of chambers, e.g., 108a-f, may be configured to etch deposited material(s) and/or the substrates. Any one or more of the processes described may be carried out in chamber(s) separated from the fabrication system shown in different embodiments. It will be appreciated that additional configurations of deposition, etching, annealing, and curing chambers for dielectric films are contemplated by system 100. Certain manufacturers may prefer systems with the flexibility of igniting and/or using plasmas in a variety of configurations, so that each system can be adapted for a corresponding variety of processing needs. The techniques disclosed herein may be adapted to plasma processing systems that ignite and/or use plasmas formed at single or multiple locations.

Although some portions of the present disclosure identify etch processes utilizing the disclosed apparatus and methods, it is to be understood that the apparatus and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described. Furthermore, it is noted that the term "chamber" as used herein should be understood as either a cavity in which a wafer or other workpiece is processed through contact with plasma products, or the structure and apparatus that forming such cavity and/or provide such plasma products.

Figure 2:
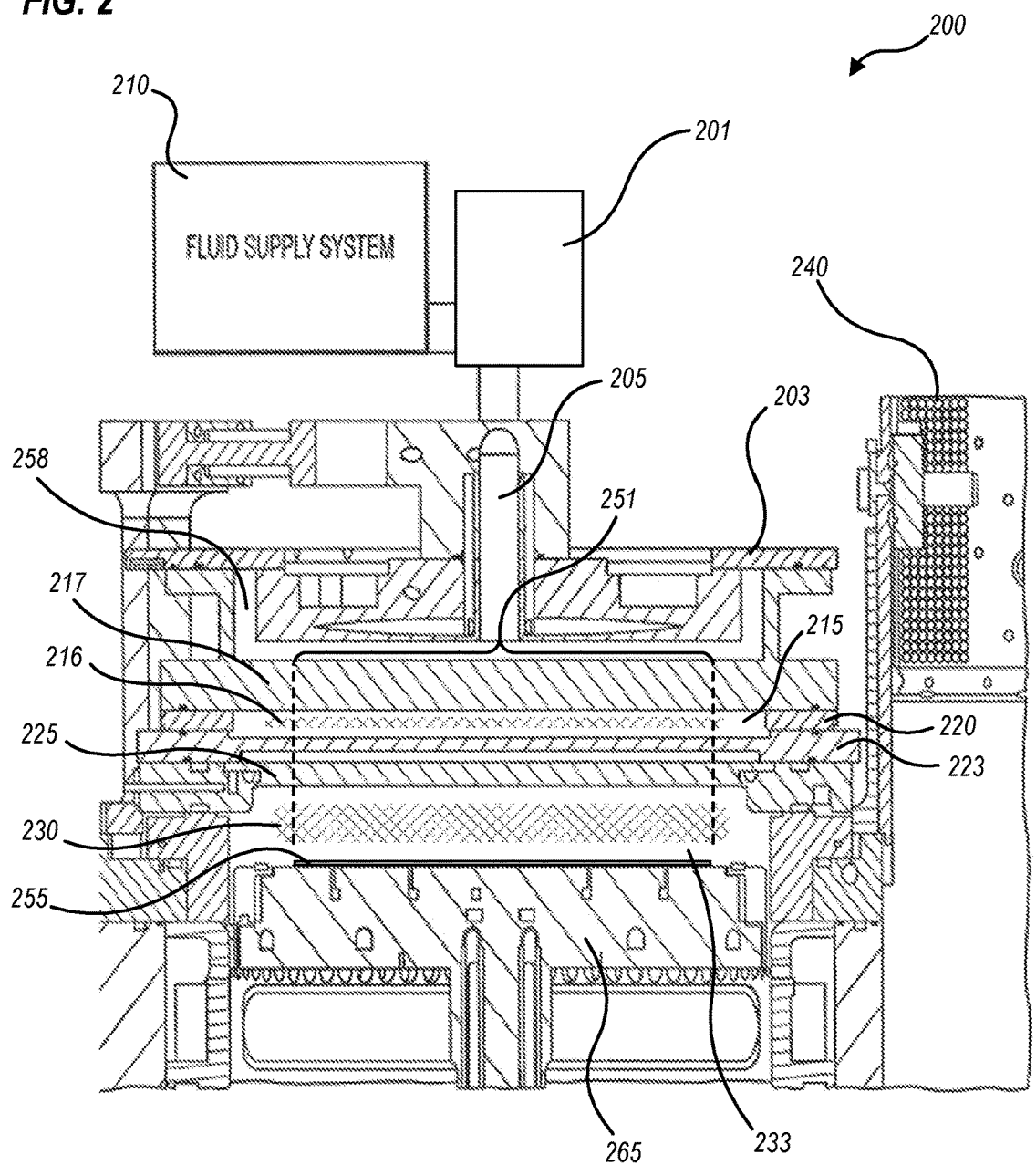
FIG. 2 schematically illustrates a portion of a plasma processing system, in a cross-sectional view, according to one or more embodiments.

FIG. 2 shows a cross-sectional view that schematically illustrates a portion of an exemplary plasma processing system 200. Plasma processing system 200 is an example of plasma processing unit 100, FIG. 1. During etching, a process gas may be flowed into a first plasma generation chamber 215 through a gas inlet assembly 205. A remote plasma system (RPS) 201 may optionally be included in the system, and may process a first gas which then travels through gas inlet assembly 205. Inlet assembly 205 may include two or more distinct gas supply channels where the second channel (not shown) may bypass RPS 201, if included. In the orientation of FIG. 2, a general direction of gas and/or plasma product flow is downwards, and this direction may be referred to as "downstream" herein, while an opposing direction upwards in the orientation of FIG. 2, may be referred to as "upstream." This convention of directions may be used herein, although one skilled in the art will understand that many of the principles described herein are not limited to systems oriented as shown in FIG. 2.

A cooling plate 203, a faceplate 217, an ion suppressor 223, a showerhead 225, and a workpiece support or pedestal 265, with a workpiece 255 disposed thereon, are shown and may each be included according to embodiments. Pedestal 265 may form one or more heat exchange channels through which a heat exchange fluid flows to control the temperature of the substrate, so as to heat and/or cool the workpiece during processing operations. A wafer support platter of pedestal 265 may be formed of aluminum, aluminum alloys, ceramics, or combinations thereof, may also be resistively heated in order to achieve relatively high temperatures, such as from about 100° C. to about 1100° C. or above, using an embedded resistive heater element.

Each of faceplate 217, ion suppressor 223, and showerhead 225 forms apertures for source gases and/or plasma products to pass through for uniform delivery of source gases and/or plasma products to a downstream workpiece processing region 233; such apertures should be understood as present, but not shown in FIG. 2 for clarity of illustration. Also, although FIG. 2 illustrates each of faceplate 217, ion suppressor 223, and showerhead 225 as solid for clarity of illustration, these components may be formed of multiple parts, as discussed below. Faceplate 217 may be pyramidal, conical, or of another similar structure with a narrow top portion expanding to a wide bottom portion. Faceplate 217 may additionally be flat, as shown.

A portion of system 200 that lies directly above workpiece 255 and extending upwards through at least showerhead 225, ion suppressor 223, and faceplate 217, is called herein a working area 251 of system 200. When workpiece 255 is round (e.g., a semiconductor wafer) working area 251 will also be round. The usual goal of components such as faceplate 217, ion suppressor 223, and showerhead 225 is to distribute gases and plasma products as uniformly as possible within the working area. However, certain embodiments herein can provide one or more added degrees of process control that can, for example, skew or correct processing across working area 251, or introduce radial or other spatial patterns of process effects within working area 251, as discussed below.

Exemplary configurations may include having gas inlet assembly 205 open into a gas supply region 258, that is partitioned from first plasma generation chamber 215 by faceplate 217 so that source gases (or plasma products, if RPS 201 is used) flow through the apertures in faceplate 217 into first plasma generation chamber 215. Structural and operational features may be selected to prevent significant backflow of plasma from first plasma generation chamber 215 back into supply region 258, gas inlet assembly 205, and fluid supply system 210. Faceplate 217, or a conductive top portion of the chamber, and showerhead 225 are shown with an insulating ring 220 located therebetween, to allow a power supply an alternating current (AC) potential to be applied to the faceplate 217 relative to showerhead 225 and/or ion suppressor 223. A power supply that provides the AC potential is called an RF power supply herein, although the power supplied might be in the radio frequency (RF) spectrum or the microwave spectrum. The AC potential enables formation of a capacitively coupled plasma (CCP) in first plasma generation chamber 215. Additional features such as baffles (not shown) may additionally be located in the first plasma generation chamber 215, or otherwise coupled with gas inlet assembly 205, to affect the flow of source gases and/or plasma products through gas inlet assembly 205 into first plasma generation chamber 215.

It should be noted that components such as cooling plate 203, faceplate 217, ion suppressor 223, showerhead 225 and/or other diffusers or screens herein may be characterized as electrodes, as any such components may be individually tied to electrical potentials. Surfaces of any of these components that are exposed to plasma and/or plasma products may be coated either with ceramic layers (e.g., yttria, alumina) or with a suitable passivating layer (e.g., an anodized layer, or a chemically generated alumina layer) for chemical resistance.

Processing system 200 may further include a power supply 240 electrically coupled with any or all of faceplate 217, ion suppressor 223, showerhead 225, and/or pedestal 265 to generate a plasma in first plasma generation chamber 215 and/or processing region 233. Power supply 240 may be configured to deliver an adjustable amount of power to the appropriate electrode(s) depending on the process performed. Such a configuration may allow for a tunable plasma to be used in the processes being performed. Unlike a remote plasma unit, which typically includes on or off functionality, a tunable plasma may be configured to deliver a specific amount of power to first plasma generation chamber 215 and/or processing region 233. This in turn may allow development of particular plasma characteristics such that source gases may be transformed to specific plasma products to enhance processing objectives such as etching profiles, selectivity, uniformity and the like.

In use, a plasma 216 may be ignited either in first plasma generation chamber 215, and/or a plasma 230 may be ignited in workpiece processing region 233, for example to produce plasma products from a fluorine-containing source gas or other source gas for etching. For example, while source gases are supplied, an AC voltage, typically in the radio frequency (RF) range, may be generated by power supply 240 and applied between the conductive top portion of the processing chamber, such as faceplate 217, and showerhead 225 and/or ion suppressor 223 to ignite plasma 216 in first plasma generation chamber 215. Similarly, with source gases (and/or plasma products from first plasma generation chamber 215) flowing, an AC voltage may be applied between showerhead 225 and pedestal 265 to ignite plasma 230 in processing region 233. Power supply 240 may operate at an RF frequency of 13.56 MHz but may also operate at other frequencies, alone or in combination with the 13.56 MHz frequency.

Certain plasma processing applications and/or workpieces such as wafers advantageously allow charged species (e.g., ions and free electrons) within plasma products to come freely into contact with a workpiece, while other applications or workpieces advantageously reduce or isolate charged species from the workpiece. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials. For example, to reduce or isolate the charged species, a plasma may generate plasma products in a region that is upstream of a process chamber. The plasma is contained to the region where it is generated, and charged species are encouraged to neutralize and/or combine with one another, but neutral species such as uncharged molecular fragments, free atoms and excited but neutral radicals are allowed to pass through to the process chamber.

Figure 3:
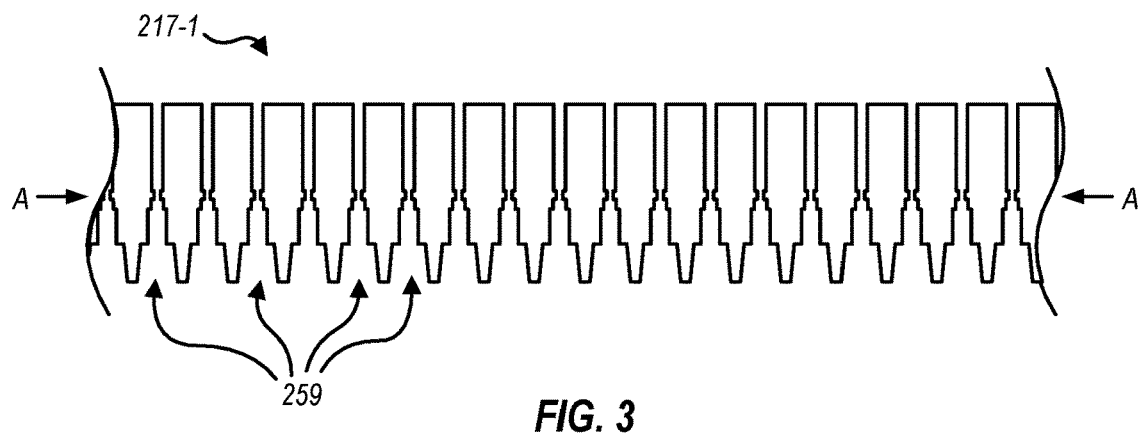
FIG. 3 schematically illustrates a portion of a faceplate that forms multiple apertures, according to one or more embodiments.

One way to contain plasma and exclude charged species from particular regions of a plasma processing system is to use an electrode that forms apertures through which neutral species and radicals can pass, but which inhibits passage of ions and/or free electrons, and through which the electric fields that generate the plasma are reduced. For example, FIG. 3 schematically illustrates a portion of a faceplate 217-1 (e.g., an example of faceplate 217, FIG. 2) that forms multiple apertures 259. The general concept of using aperture widths to selectively contain or allow passage of ionic species and/or free electrons is now discussed using faceplate 217-1 as an example. However, it should be clear that the principles taught can pertain to other parts of a plasma processing system where a plasma is generated in one location and transmitted through an electrode to another location, or where a plasma is generated in a location of intended use and apertures are used to limit backstreaming of ionic species and free electrons to unintended locations.

Each aperture 259 forms a narrow passageway about halfway through faceplate 217-1 between points A-A, as shown. The width of apertures 259 between points A-A can be such that the electromagnetic power that generates and/or sustains the plasma above faceplate 217-1 (e.g., in first plasma generation chamber 215, FIG. 2) is strongly attenuated within apertures 259, and ionic species and free electrons are forced through collisions and other wall effects to recombine and/or neutralize one another. A width of apertures 259 that will limit passage of ionic species and free electrons is related to the Debye length of the plasma, and can be calculated based on factors such as a wavelength of the electromagnetic power generating the plasma, the gas species from which the plasma is formed, and pressure of the plasma. It should also be noted that complete segregation of ionically charged species may not be desired in all embodiments. For example, in certain instances, some ionic species are intended to reach a processing region in order to perform an etch and/or deposition process. In these instances, apertures 259 of electrodes such as faceplate 217-1 may be sized so as to merely reduce, but not eliminate, ionic species in the processing region. Other factors may also influence an optimum width of apertures 259, such as material properties of faceplate 217-1 and/or coatings thereon. Thus, determination of width of apertures 259 for a given type of plasma system is usually determined empirically. An adjustable electrical bias may also be applied to faceplate 217-1 as an additional means to control the flow of ionic species through the faceplate.

It should be understood that apertures 259 are formed in faceplate 217-1 across an entire working area of the faceplate (e.g., working area 251, FIG. 2) and that a distance between faceplate 217-1 (or any other electrode herein having numerous apertures for plasma products to pass through) and workpiece 255 is great enough, as compared with spacing of apertures 259, for the plasma products to mix uniformly by the time they reach workpiece 255.

By using apertures 259 with narrow passageways, a process chamber may be configured to inhibit plasma, free electrons and/or ionic species from contact with a workpiece being processed. This may advantageously protect a variety of intricate structures and films patterned on the substrate, which could be warped, dislocated, or otherwise damaged if directly contacted by a plasma. Additionally, when plasma is allowed to contact or approach the workpiece, the rate at which oxide species etch may increase. Accordingly, if an exposed region of material is oxide, the material may be further protected by maintaining the plasma remotely from the substrate.

The principle of utilizing small apertures to contain plasma and suppress the flow of charged species can be applied to any electrode such as faceplate 217, ion suppressor 223 and/or showerhead 225, between a plasma generation region and a processing region, or between plasma generated in a processing region, and upstream regions. However, use of this principle can result in certain costs and constraints. Apertures 259 are generally formed by drilling in order to control the narrow passageway widths, and many such apertures are typically needed to provide enough plasma product throughput to maintain process reaction rates (e.g., etch or deposition rates) high enough for satisfactory workpiece throughput. Apertures 259 must also be very consistent in size, because process deviations may occur if certain spatial regions of an electrode have apertures 259 that are narrower or wider than in other spatial regions. To meet these needs, drilling alone can amount to thousands of dollars of labor and/or equipment time invested per electrode.

It is also very difficult to coat narrow apertures 259 uniformly with protective coatings (for example, yttria or alumina) to protect the electrode through which the apertures are formed. The high aspect ratio of apertures 259, particularly in the narrowest regions, tends to cause nonuniform coating thickness, and limits coating thicknesses that can be applied, because most coating techniques are directional. That is, the coating material tends to stick to the first object that it encounters. Typical coating techniques for applying yttria or alumina on aluminum parts include plasma spraying and atomic layer deposition. Plasma spraying is moderately precise and moderately expensive, while atomic layer deposition is extremely precise and extremely expensive; both techniques are at least somewhat directional. Thus, with either technique, coating tends to build up readily on flat plates, and much slower within passageways that are substantially parallel with the direction along which the coating material travels during deposition. Atomic layer deposition provides good control over thickness, even within apertures 259, but plasma spraying that is sufficient to coat far within apertures 259 can build up at the outer edges of the apertures, resulting in size variation among the apertures.

Still furthermore, when the area of an electrode that permits passage of plasma products is constricted by forming very small apertures therethrough, the flow of the plasma products is necessarily reduced, which slows down the desired processes such as deposition and etching. Additionally, once apertures 259 of the size and number required are formed, they cannot be readily changed; if a different aperture size is required to support a different process or a desired change of process parameters, an entire electrode must be removed and replaced with a different one. Opening up a process chamber is generally undesirable in plasma processing equipment, because electrode surfaces are generally exposed only to tightly controlled conditions and/or substances during use; opening the chamber to atmosphere usually disrupts chamber surface conditioning, resulting in a need to recondition the surfaces and test chamber performance before production processing is allowed to resume.

Certain embodiments herein provide plasma containment and ion suppression by utilizing a plurality of electrodes with apertures therethrough, wherein the apertures can be of almost any size, but whose alignment or misalignment with respect to one another is controlled, and wherein the electrodes are maintained in extremely close proximity to one another. In these embodiments, a gap between the electrodes can play the same role as the narrow passageways of apertures 259 described above. While this approach results in new constraints, such as needs for electrode planarity and gap distance control, most or all of the constraints noted above are mitigated or eliminated. For example, drilling costs for the electrodes can be reduced because electrode apertures can be fewer and larger; coating difficulties for the electrodes can be reduced because electrode aperture aspect ratios are decreased, and available area for throughput of plasma products can be increased. Also, through the use of appropriate mechanisms as described below, electrode gap distance and/or aperture alignment can be adjusted to provide process effects. One result of this is that gap distance and/or aperture alignment can be changed substantially, in situ, from time to time so that different processes can be performed without removing and replacing electrodes or using multiple pieces of process equipment.

Figure 4:
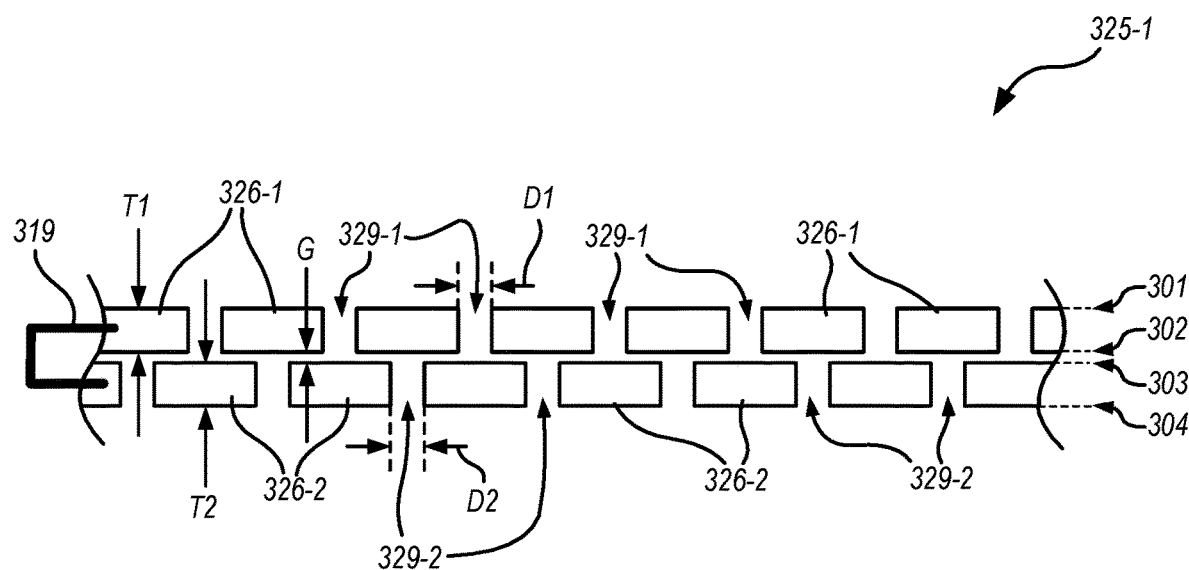
FIG. 4 schematically illustrates a portion of a two part electrode assembly, in a cross-sectional view, according to one or more embodiments.

FIG. 4 schematically illustrates a portion of a two part electrode assembly 325-1 that includes individual electrodes 326-1 and 326-2, in a cross-sectional view. The principles now described in connection with FIG. 4 can be applied, in embodiments, to any electrode or set of electrodes that separate portions of a plasma system, such as separating a plasma generation region from a process chamber and/or from other electrodes. For example, two part assembly 325-1 could take the place of ion suppressor 223 and/or showerhead 225, FIG. 2. One of ordinary skill in the art would immediately conceive of many alternatives, variations and/or equivalents, all of which are considered within the scope of this disclosure. Electrodes 326-1 and 326-2 may be fixedly coupled with one another or may be movable with respect to one another, as discussed further below. Electrodes 326-1 and 326-2 are typically held at a common electrical potential, for example by connecting them through an optional RF grounding strap 319.

Each of electrodes 326-1 and 326-2 forms many apertures 329-1, 329-2 respectively, in the illustrated plane of FIG. 4, but are continuous in other planes, such that the pieces illustrated in FIG. 4 are but parts of each electrode 326-1 and 326-2. Each aperture 329-1 has a diameter D1, and each aperture 329-2 has a diameter D2. FIG. 4 shows D1 and D2 as approximately equal, but this is not required, and it is not required that D1 or D2 be the same across all apertures of either electrode. In certain embodiments, nominally similar diameters across each electrode advantageously provide ease of layout and drilling efficiency. Electrode 326-1 defines a first planar surface 301 and a second planar surface 302 separated by an electrode thickness T1; electrode 326-2 defines a third planar surface 303 and a fourth planar surface 304 separated by an electrode thickness T2. FIG. 4 shows T1 and T2 as approximately equal, as found in certain embodiments, but this, is not required. In practice, T1 and T2 are typically chosen based on the lateral dimensions of electrodes 326-1 and 326-2 and based on the electrode material(s), such that the electrodes are mechanically stable across an intended process chamber, but advantageously not much greater than needed to ensure mechanical stability, for reduced weight and material cost. For example, in certain embodiments, T1 and T2 are about one quarter inch (e.g., 4 to 8 mm) for a plasma processing system that processes 12 inch (300 mm) nominal wafers, but in other embodiments of other sizes or having other constraints, T1 and T2 could range from 0.100 inch to about 1.00 inch (e.g., 2 to 25 mm). In certain embodiments, D1 and D2 are chosen so that an aspect ratio T/D of apertures 329-1, 329-2 is about 2:1 or less, to promote uniform application of coatings within the apertures. However, other embodiments use apertures with aspect ratios greater than 2:1, particularly when techniques such as chamfering are used to make inside walls of the apertures more accessible for application of coatings (see FIG. 5).

Apertures 329-1 and 329-2 are arranged or are at least adjustable so that no line-of-sight from above assembly 325 to below assembly 325 exists through any pair of apertures 329-1 and 329-2. Thus, when a plasma or gas exists above assembly 325, individual species such as ions, molecular fragments, individual atoms or free electrons can only pass through assembly 325 by passing first through an aperture 329-1, then between electrodes 326-1 and 326-2, then through an aperture 329-2. Electrodes 326-1 and 326-2 are separated by a gap of distance G between surfaces 302 and 303, as shown. G can be chosen so as to contain plasma and suppress the flow of charged species, from above assembly 325, to below it.

The value of gap distance G that will accomplish these objectives is a function of plasma source gas type, plasma pressure, power density applied to the plasma, and aperture-to-aperture registration. For charged species containment, gap distance G should be about, or smaller than, the minimum aperture size that would support a hollow-cathode discharge. Thus, typical values of gap distance G to contain plasma are generally on the order of 0.002 inches to 0.150 inches (e.g., about 0.05 mm to 3.81 mm). Higher pressures and power densities will promote the possibility of plasma "leakage" (e.g., passage of charged species through the two electrode assembly), other variables being equal. For example, useful upper bounds for gap distance G may be about 0.045 inch and 0.035 inch for certain source gases and power densities at 10 and 20 Torr respectively, but G could vary further for higher or lower pressures, or due to other variables. Because of all the variables involved, an upper end of gap distance G that will contain charged species may be any of 0.002 inches, 0.005 inches, 0.010 inches, 0.015 inches, 0.020 inches, 0.025 inches, 0.030 inches, 0.035 inches, 0.036 inches, 0.040 inches, 0.045 inches, 0.048 inches, 0.050 inches, 0.055 inches, 0.060 inches, 0.065 inches, 0.070 inches, 0.075 inches, 0.080 inches, 0.085 inches, 0.090 inches, 0.095 inches, 0.100 inches, 0.105 inches, 0.110 inches, 0.115 inches, 0.120 inches, 0.125 inches, 0.130 inches, 0.135 inches, 0.140 inches, 0.145 inches or 0.150 inches, or values intermediate to those listed. Lower bounds of G can be set based on known or estimated planarity variations of the electrodes, and built-in offsets for gap distance calibration purposes, such as described below. Lower bounds of G for certain embodiments are 0.005 to 0.010 inches.

In certain embodiments, electrodes 326-1 and 326-2, and thus apertures 329-1 and 329-2, are fixed with respect to one another. In other embodiments, at least one of electrodes 326-1 and 326-2 is adjustable with respect to the other, so that for at least one position with any applicable ranges of adjustment (as discussed below), a lateral distance between any aperture 329-1 and a nearest aperture 329-2 is at least two or at least three times G. By increasing the probability of charged species interacting with surfaces of at least one of electrodes 326-1 and 326-2, these lateral distances advantageously minimize any tendency for ionized species or free electrons to move from above assembly 325, through apertures 329-1 and 329-2 that are close to one another, to below assembly 325. However, a combination of small gap distance G (e.g., less than about 0.005 or 0.010 inches) and/or large lateral distances (e.g., more than three times G) may also reduce passage of neutral radicals and atomic species. Considering all of the effects, certain useful values of G to contain charged species but allow neutral species passage are:

Gap distance G between 0.005 to 0.035 inches and lateral distance between apertures at least twice gap distance G; especially for (but not limited to) plasmas operating at or around 20 Torr pressure; and Gap distance G between 0.010 to 0.045 inches and lateral distance between apertures at least twice gap distance G; especially for (but not limited to) plasmas operating at or around 10 Torr pressure.

Also, as described further below, gap distance G between electrodes 326-1 and 326-2 may be intentionally varied from a plasma-containing gap distance to a larger distance that allows plasma leakage, to tailor processing characteristics. The gap distance G can control both whether leakage exists at all, and the amount of leakage, thus providing a mechanism for controlling a ratio between neutral and charged species passing through a two electrode assembly.

Figure 5:
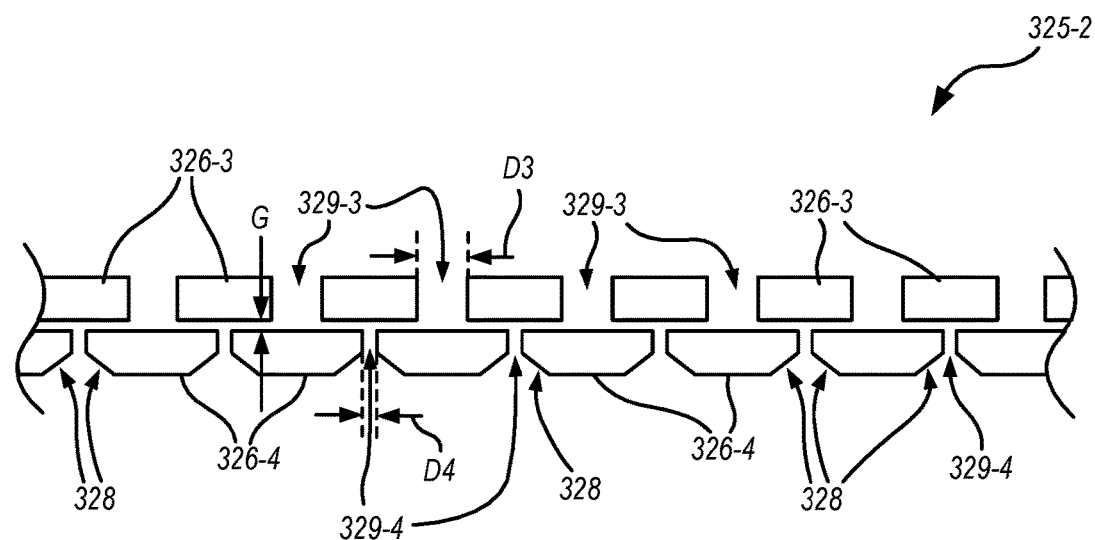
FIG. 5 schematically illustrates a portion of another two part electrode assembly, in a cross-sectional view, according to one or more embodiments.

FIG. 5 schematically illustrates a portion of another two part assembly 325-2 that includes individual electrodes 326-3 and 326-4, in a cross-sectional view. Assembly 325-2 differs from assembly 325-1 by the diameters of apertures 329-3, 329-4 through electrodes 326-3 and 326-4 respectively being different from diameters of apertures 329-1, 329-2 through electrodes 326-1 and 326-2 (FIG. 4) and by apertures 329-4 forming chamfered edges 328, as shown. Chamfered edges 328 help to improve coating uniformity within apertures 329-4 when diameter D4 is substantially smaller than a thickness of electrode 326-4, resulting in a high aspect ratio.

In certain embodiments, electrodes 326 are coupled fixedly with respect to one another and/or other plasma chamber components. These embodiments can be both less expensive to manufacture, and more durable, than systems with electrodes having very small apertures for ion and free electron control. The reduced cost is due to reduced drilling cost and reduced coating cost, while the durability can be improved by applying thicker coatings using plasma spraying, as opposed to atomic layer deposition. Electrodes 326 can also support higher plasma processing rates, because they provide freer passage of desired (neutral) plasma products, while blocking the components that are less desirable for certain processes, such as ions and free electrons.

Figure 6A:
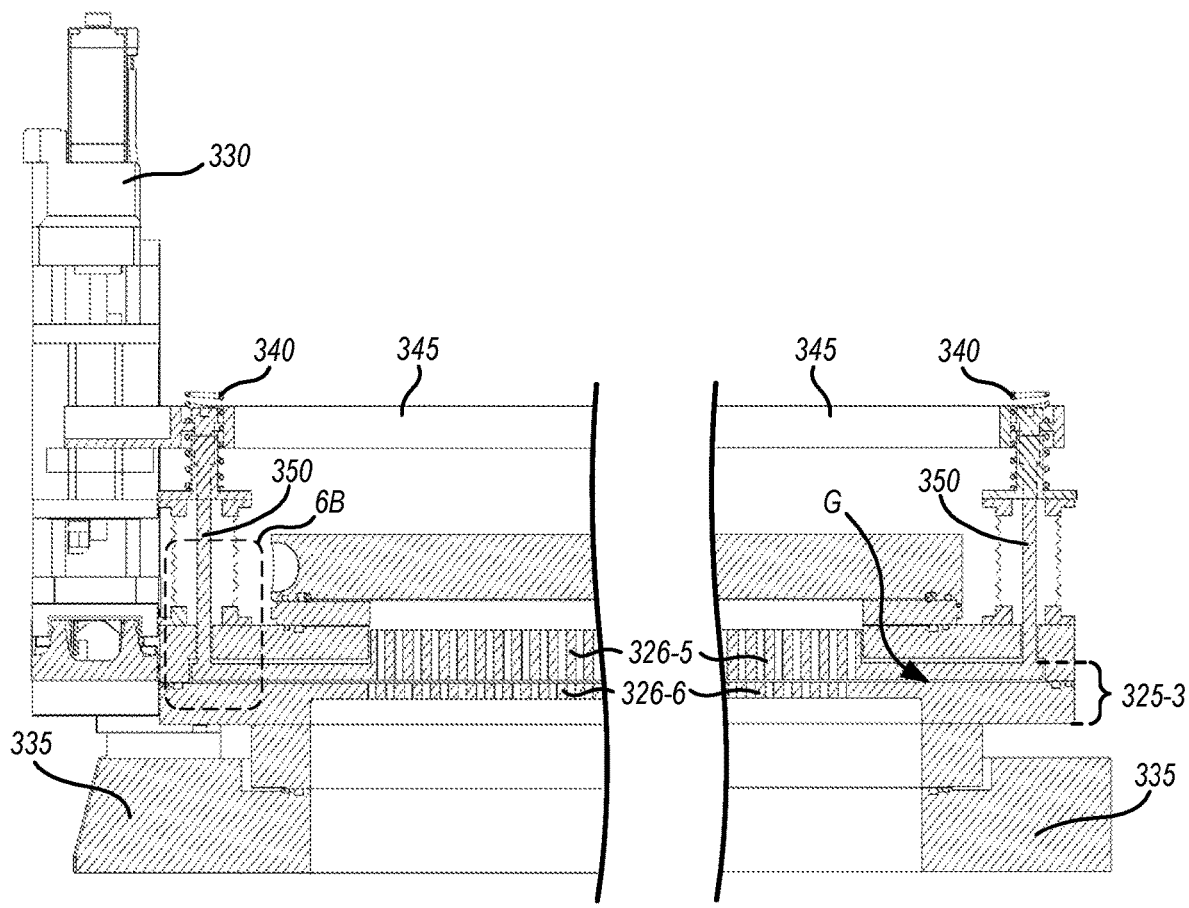
FIG. 6A schematically illustrates a two part electrode assembly that includes two electrodes and an adjustable coupler, in a cross-sectional view, according to one or more embodiments.

FIG. 6A schematically illustrates a two part electrode assembly 325-3 that includes two electrodes 326-5 and 326-6 and an adjustable coupler, in a cross-sectional view. FIG. 6A is shown in two portions with a break in between, to allow features on either side to be shown in greater detail. A portion within FIG. 6A identified as 6B is enlarged in FIG. 6B.

In FIG. 6A, the adjustable coupler is a height actuator 330, which is operable through electronic input to adjust gap G between electrodes 326-5 and 326-6. As used herein, "actuators" refer to adjustable couplers that can move or reposition one object with respect to another in response to electronic input, while other adjustable couplers may be adjusted manually or with hand tools. A support portion 335 provides a mechanical reference and support for assembly 325-3; lower electrode 326-6 is coupled fixedly with support portion 335. Support portion 335 is, for example, a base or a housing of a plasma processing system. Upper electrode 326-5 couples both with height actuator 330 and with a suspension mechanism 340. Suspension mechanism 340 is represented by coil springs in FIG. 6A, although other suspension mechanisms are possible, such as for example leaf springs, or pneumatic systems. In the illustrated embodiment, suspension mechanism 340 transfers at least most of the weight of upper electrode 326-5 to support portion 335, to reduce mechanical demands on height actuator 330, and to possibly improve precision of height control provided by height actuator 330. Suspension mechanism 340 is optional, however, and is not included in certain embodiments.

Height actuator 330 is operable to adjust gap G between surface 302 of electrode 326-5 and surface 303 of 326-6. Height actuator 330 is a stepper motor in embodiments, although other height actuators may be used, such as other types of motors, solenoids, piezoelectric actuators and the like. Stepper motors are advantageous height actuators because they can be controlled electronically and can provide fine height control in response to such control. In the embodiment illustrated in FIG. 6A, height actuator 330 couples with a ring 345 (see also FIGS. 7, 8) that connects, via rods 350, to upper electrode 326-5.

Other members and/or mechanisms may be used to couple an actuator with an electrode. Similarly, an upper electrode of a two piece electrode assembly may be fixed (e.g., to a base or housing) while the lower electrode is adjustable. One of ordinary skill in the art would immediately conceive of many alternatives, variations and/or equivalents, all of which are considered within the scope of this disclosure.

Figure 6B:
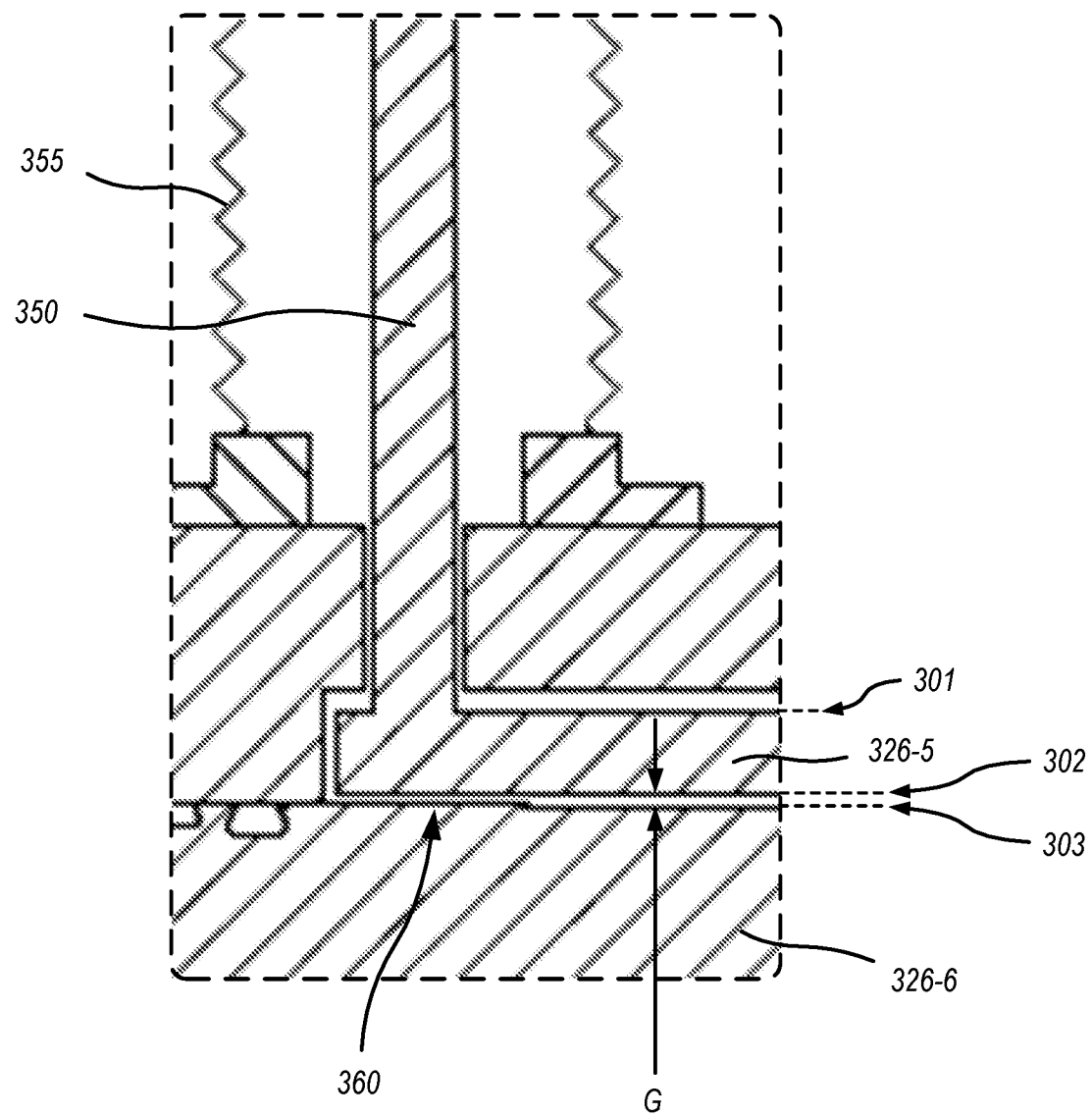
FIG. 6B schematically illustrates a portion noted within FIG. 6A, in an enlarged view, according to one or more embodiments.

FIG. 6B schematically illustrates the portion within FIG. 6A noted as 6B, in an enlarged view. As shown in FIG. 6A, rod 350 connects with upper electrode 326-5, this enables height actuator 330 to adjust gap G. Lower electrode 326-6 includes an optional region 360 that forms a slight protrusion with respect to surface 303. This allows region 360 to be used as a mechanical stop to establish a zero position or height reference between electrodes 326-5 and 326-6 without bringing surfaces 302 and 303 into direct contact with one another. In one way of establishing a height reference, height actuator 330 can be operated until surface 302 is in contact with region 360, and a position of height actuator 330 when surface 302 is in contact with region 360 can be designated the zero position or reference height for height actuator 330. For example, a controller can provide electronic input to a stepper motor acting as height actuator 330 until surface 302 is in contact with region 360, the electronic input can be released with the electrodes in contact, the electronic input can be reestablished at the position of contact, and height adjustments can be made by backing off the stepper motor by a known number of steps. Alternatively, an electronic input value that brings the electrodes into contact can be stored as a zero value, and height adjustments can be made by varying the electronic input relative to the stored value. Thereafter, since the distance response of the stepper motor to a given number of steps is known, height actuator 330 can be operated so as to increase gap G by a known amount with respect to the reference height. Using region 360 to establish contact between first and second electrodes 326-5, 326-6 in this manner allows calibration of gap G while avoiding face-to-face contact of surfaces 302 and 303. This, in turn, minimizes the chance of accidental damage resulting from contact between surfaces 302 and 303, or at least moves the point of contact away from the center of electrodes 326-5 and 326-6, where any damage is more likely to affect workpiece (e.g., wafer) processing. A height of region 360 relative to its adjacent surface (e.g., surface 303 in FIG. 6B) is advantageously greater than anticipated planarity variations of surfaces 302 and 303, but less than a height that would begin to allow ionized species through a gap formed between surfaces 302 and 303 when region 360 contacts the opposing surface. In certain embodiments, a height of region 360 relative to its adjacent surface is 0.005 inch or less, with estimated planarity variations of surfaces 302 and 303 (combined) being about 0.004 inch, and an estimated gap distance above which ionized species could begin to leak through the gap being about 0.010 inch. Although region 360 is shown as a protrusion with respect to surface 303, it is understood that region 360 could be implemented as a protrusion with respect to surface 302, or protrusions with respect to both surfaces 302 and 303. FIG. 6B also illustrates a bellows 355 that surrounds rod 350; bellows 355 isolates rod 350 and its surrounding mechanical features from adjacent areas in order to exclude any particles or debris generated by moving parts associated with actuator 330, suspension mechanism 340 and the like.

Figure 7:
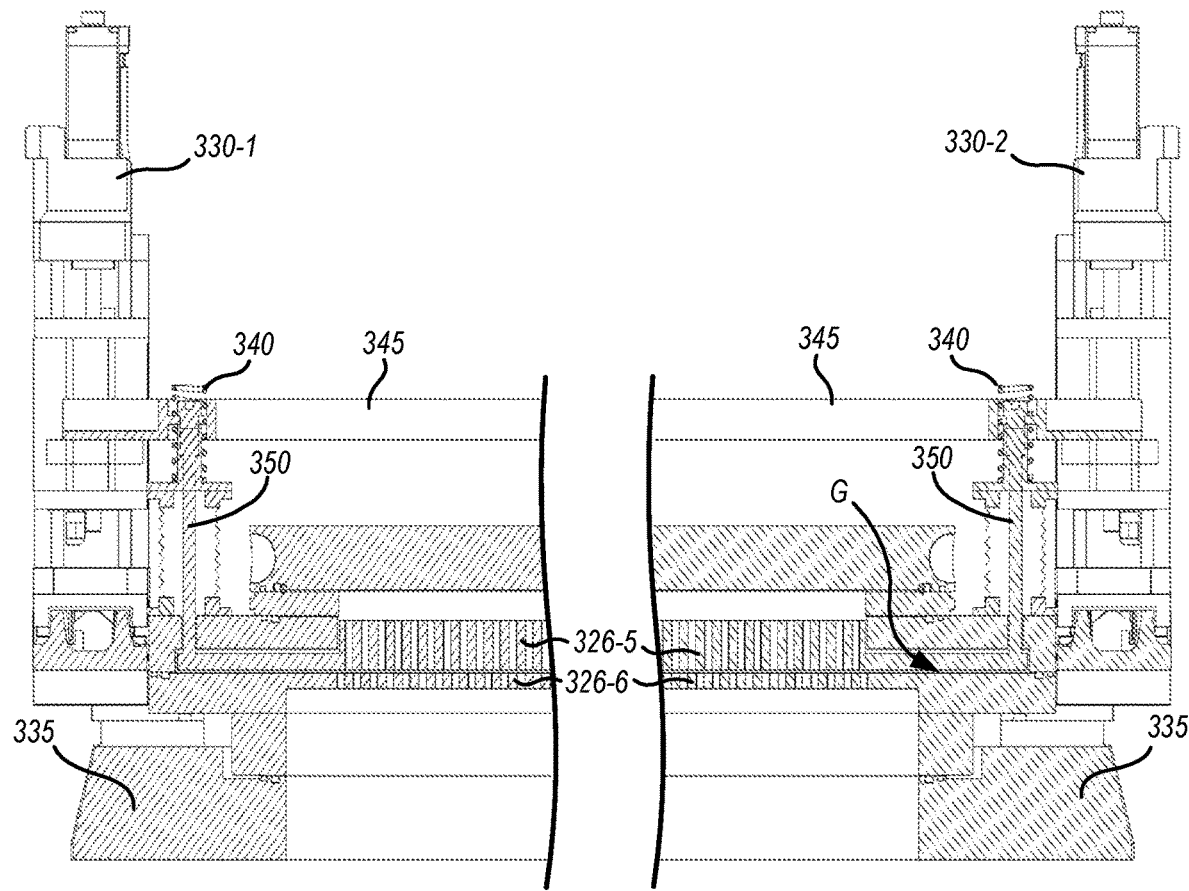
FIG. 7 schematically illustrates a two piece electrode assembly with two actuators for adjusting vertical position of one electrode with respect to another electrode, in a cross-sectional view, according to one or more embodiments.

FIG. 7 schematically illustrates a two piece electrode assembly with two actuators for adjusting vertical position of one electrode with respect to another electrode, in a cross-sectional view. The assembly shown in FIG. 7 is the same as that shown in FIGS. 6A and 6B, except that two height actuators 330-1 and 330-2 adjust height of ring 345, connected with lower electrode 326-6, at different locations around a circumference of ring 345. In this embodiment, coupling points between height actuators 330-1 and 330-2, and ring 345 and/or support portion 335, are nonrigid so that a mechanical system thus formed is not overconstrained, that is, one or both coupling points may form angles necessary for ring 345 to be at one height at height actuator 330-1, and another height at height actuator 330-2, relative to support portion 335. By providing height adjustment at two points around ring 345, gap G can be adjusted to be greater on one side than the other, forming a tilt. The azimuthal tilt axis between electrodes 326-5 and 326-6 (e.g., a direction from one peripheral point where gap G is greatest, to another peripheral point where gap G is smallest) would align with the coupling points of ring 345 with electrodes 326-5 and 326-6. Mechanical stops (e.g., protrusions like protrusion 360, FIG. 6B) can be provided adjacent to each height actuator 330-1, 330-2 so that reference heights for actuators 330-1, 330-2 can be set independently of one another.

Figure 8:
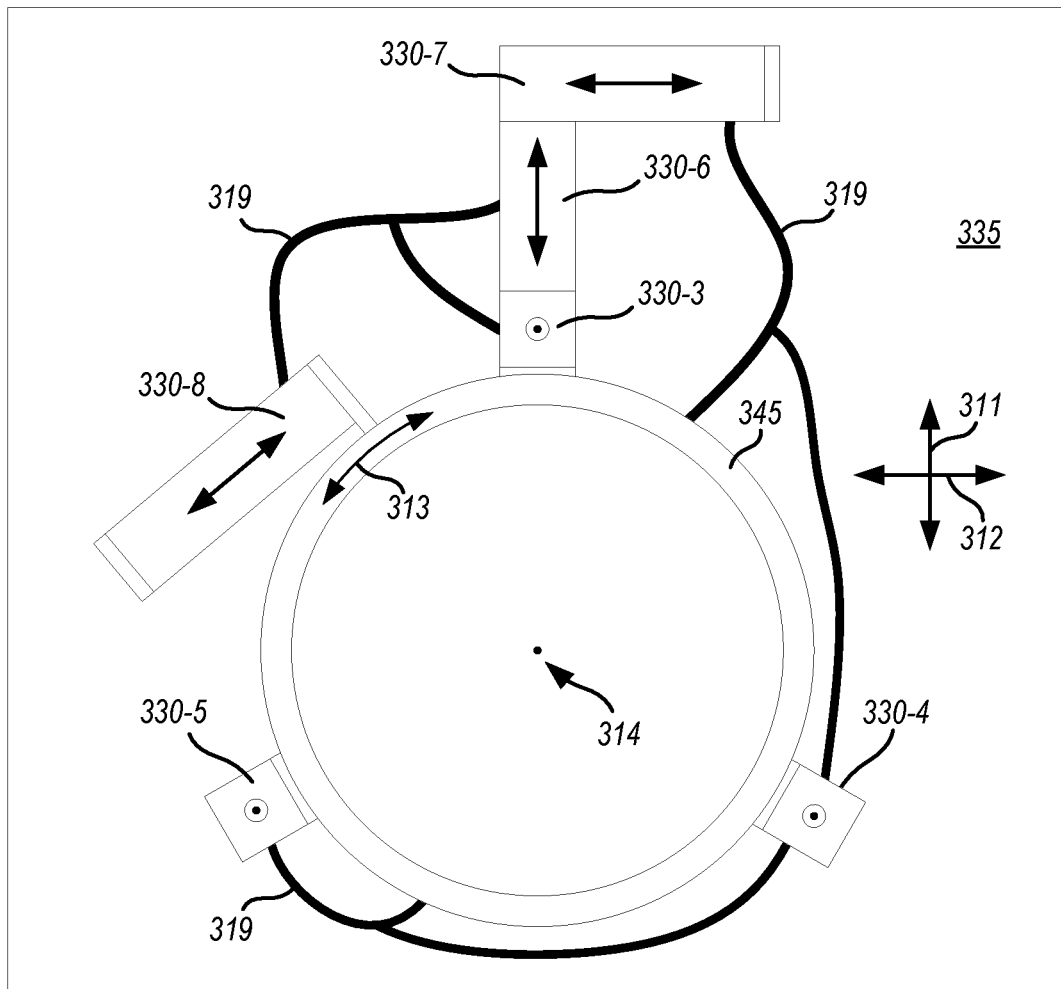
FIG. 8 schematically illustrates an assembly with six actuators for adjusting position of a ring with respect to an underlying support portion, in a plan view, according to one or more embodiments.

One skilled in the art can see that a further extension of the approach illustrated in FIG. 7, but including three actuators with coupling points spaced around ring 345, could set an azimuthal tilt axis of a gap thus formed to any direction, by coordinating height of all three height actuators. Also, actuators that control lateral position of electrodes are also possible. FIG. 8 schematically illustrates an assembly with six actuators for adjusting lateral and vertical positions of a ring 345 with respect to a support portion 335, in a plan view. Support portion 335 is for example a base or a housing of a plasma processing system, such as shown in FIGS. 6A and 7. In FIG. 8, a vertical direction, shown in FIGS. 2-7 as vertical in the drawings, is in and out of the page, while directions 311 and 312 are horizontal directions. Ring 345 can be used to position one electrode of a two piece electrode assembly, where the other electrode of the two piece electrode assembly is fixedly coupled with support portion 335. An underside of ring 345 couples with one of the two electrodes, which are hidden by ring 345 and other structures in the plan view of FIG. 8. Three height actuators 330-3, 330-4 and 330-5 couple with ring 345 so that a gap G between the two electrodes can be adjusted and so that the gap can be formed along any desired azimuthal tilt angle. Coupling points between height actuators 330-3, 330-4 and 330-5 and ring 345 and/or support portion 335, are nonrigid so that a mechanical system thus formed is not overconstrained. Although FIG. 8 shows height actuators 330-3, 330-4 and 330-5 and ring 345 as spaced approximately equidistant around ring 345, it is understood that equal spacing is not required. As discussed above, various embodiments may include only one, two, or all three of height actuators 330-3, 330-4 and 330-5, and height actuators 330-3, 330-4 and 330-5 can all be considered examples of adjustable couplers that could also be operated manually or using hand tools.

A first horizontal actuator 330-6 and a second horizontal actuator 330-7 are operable to position height actuator 330-3 and ring 345 in different horizontal directions relative to support portion 335. A third horizontal actuator 330-8 is operable to position ring 345 rotationally with respect to support portion 335. Coupling points between horizontal actuators 330-6, 330-7 and 330-8 and ring 345 and/or support portion 335, are also nonrigid so that a mechanical system thus formed is not overconstrained (e.g., the combined actions of height actuators 330-6, 330-7 and 330-8 do not twist or deform ring 345). Various embodiments may include only one, two, or all three of horizontal actuators 330-6, 330-7 and 330-8, and horizontal actuators 330-6, 330-7 and 330-8 can all be considered examples of adjustable couplers that could also be operated manually or using hand tools. Any or all of height actuators 330-3, 330-4 and 330-5, horizontal actuators 330-6, 330-7 and 330-8, ring 345 support portion 335 and/or electrodes positioned thereby may be held at a common electrical potential by connecting them through optional RF grounding straps 319, as illustrated in FIG. 8. Also, mechanical stops may be used to set reference values for each of horizontal actuators 330-6, 330-7 and 330-8 (e.g., in the same manner as region 360 can be used to set a reference value for height actuator 330; see FIG. 6B).

Thus, horizontal actuators 330-6, 330-7 and 330-8 are collectively capable of positioning ring 345 and an electrode that ring 345 couples with, along any of horizontal directions 311 and 312, and rotational direction 313 relative to a central axis 314 of ring 345, as shown, within an adjustment range of each of horizontal actuators 330-6, 330-7 and 330-8.

The ability to control both lateral and vertical spacing of electrodes in a plasma processing system provides advantages not previously available in such systems. First, effects of height actuators 330-1, 330-2 and/or 330-3 are considered. When the overall gap distance is sufficiently small, a lateral spacing of about three times the gap distance is believed sufficient to ensure neutralization of free electrons and ions, given that there may be a small subset of free electrons and/or ions that find their way from one aperture, through the gap and to another aperture, through collisions. When gap spacing is large, free electrons and/or ions will move through freely. An exact distance sufficient to allow free passage of free electrons and/or ions is related to an effective Debye length of the applicable plasma, but for practical purposes this distance is determined by process characterization. One height actuator 330 is sufficient to adjust the gap distance G globally; two height actuators 330 enable the gap distance to be tilted along one azimuthal direction (defined by a line between attachment points of the actuators with the movable electrode); and three height actuators 330 enable a tilt to be worked into the gap distance along any azimuthal direction. This can be used to shift processing from domination by neutral species chemistry to ionic chemistry and vice versa, and can provide a process control bias from one side of the system to the other.

Next, effects of horizontal actuators 330-6, 330-7 and 330-8 are considered. In certain embodiments, adjustment ranges of one or more of horizontal actuators 330-6, 330-7 and 330-8 are sufficient to move apertures 329 of electrodes 326 relative to one another, sufficiently to modify the ability of the two piece electrode apparatus to permit or inhibit throughput of certain plasma products. That is, within the adjustment ranges of horizontal actuators 330-6, 330-7 and/or 330-8, certain positions may correspond to apertures 329 being out of alignment, so that no apertures 329 in one of the electrodes 326 align with any of apertures 329 in the other electrode 326, to form an open straight-line path extending through both of the electrodes. Adjusted in this manner, free electrons and ionic species tend to contact, and be neutralized by, one or the other of electrodes 326. In addition to not forming an open straight-line path, these positions may meet the condition that apertures 329 in one of the electrodes 326 are laterally positioned at least three times the local gap distance from apertures 329 in the other electrode 326. That is, adjacent to each aperture 329 in one electrode, the gap is bounded by electrode material, not an aperture, for least three times the gap distance from any aperture 329 in the other electrode 326, measured laterally in any direction.

When two electrodes are provided with similar aperture layouts, translation of one electrode relative to another can bring apertures 329 on one electrode into, or out of, horizontal proximity or alignment with apertures 329 on the other electrode, all at the same time. Bringing all of the apertures into alignment at the same time (e.g., see FIGS. 9C, 10B) allows selective admittance or inhibition of free electrons and/or ions across the entire working area of a processing system (e.g., working area 251 of plasma processing system 200, FIG. 2). Rotation of one electrode with respect to the other can cause very different effects. Radially symmetric layouts can, when one electrode is rotated relative to another, cause apertures far away from the center of rotation to come into alignment (e.g., see FIG. 12) with areas where the apertures are aligned moving closer to the center for as rotation is increased. This can be utilized to modify processing by creating process effects related to radial position within the working area. Layouts with different (e.g., non-radial) symmetry can generate other patterns of overlap or non-overlap of aperture areas. All such patterns can be used to provide degrees of process control by regulating throughput of free electrons and/or ions relative to throughput of unionized plasma species, across the two piece electrode assembly. The possible variations of such throughput regulation are thought to be more diverse than achievable with previous electrode assemblies; some such variations, and how they are achieved, are discussed in detail below.

Figure 9A:
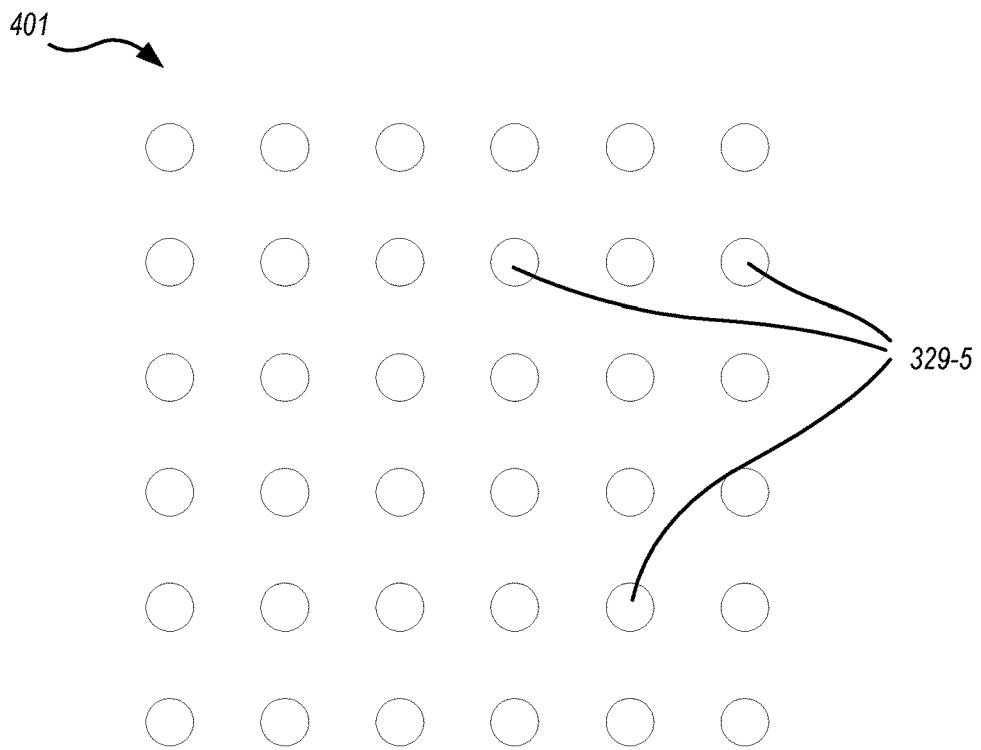
FIG. 9A schematically illustrates a layout of apertures that could be formed in an electrode of a two piece electrode assembly, in a plan view, according to one or more embodiments.
Figure 9B:
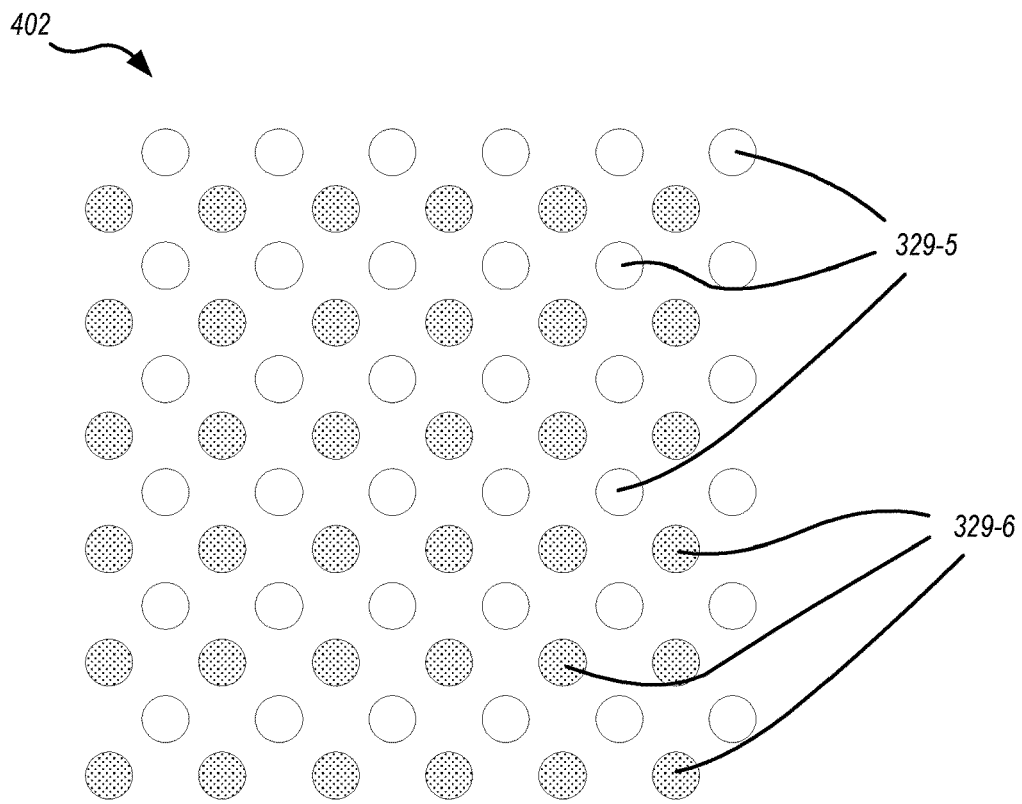
FIG. 9B schematically illustrates a layout that includes the apertures illustrated in FIG. 9A, and apertures of a second electrode, also in a rectangular arrangement, in a plan view, according to one or more embodiments.

FIG. 9A schematically illustrates a layout 401 of apertures 329-5 that could be formed in an electrode of a two piece electrode assembly, in a plan view. Apertures 329-5 are not drawn to any particular scale, but are uniform in size and layout with respect to one another, as illustrated. Layout 401 is a rectangular arrangement; it should be understood that layout 401 could be continued throughout a working area of an electrode (e.g., see working area 251, FIG. 2). FIG. 9B schematically illustrates a layout 402 that includes apertures 329-5 as in layout 401, and apertures 329-6 of a second electrode, also in a rectangular arrangement, and interspersed with apertures 329-5. Apertures 329-6 are also not drawn to any particular scale but are uniform in size and layout with respect to one another and with respect to apertures 329-5, as illustrated. Apertures 329-5 could be formed within an upper of two electrodes with apertures 329-6 formed within a lower of the two electrodes, or vice versa. Like faceplate 217-1 discussed above (FIG. 2), it should be understood that apertures 329-6 in layout 402 could be continued across an entire working area of an electrode. Also like faceplate 217-1, a distance between the electrodes that form apertures 329-5 and 329-6 and a workpiece to be processed is great enough, as compared with spacing of apertures 329-5 and 329-6, for plasma products to mix uniformly by the time they reach the substrate.

Figure 9C:
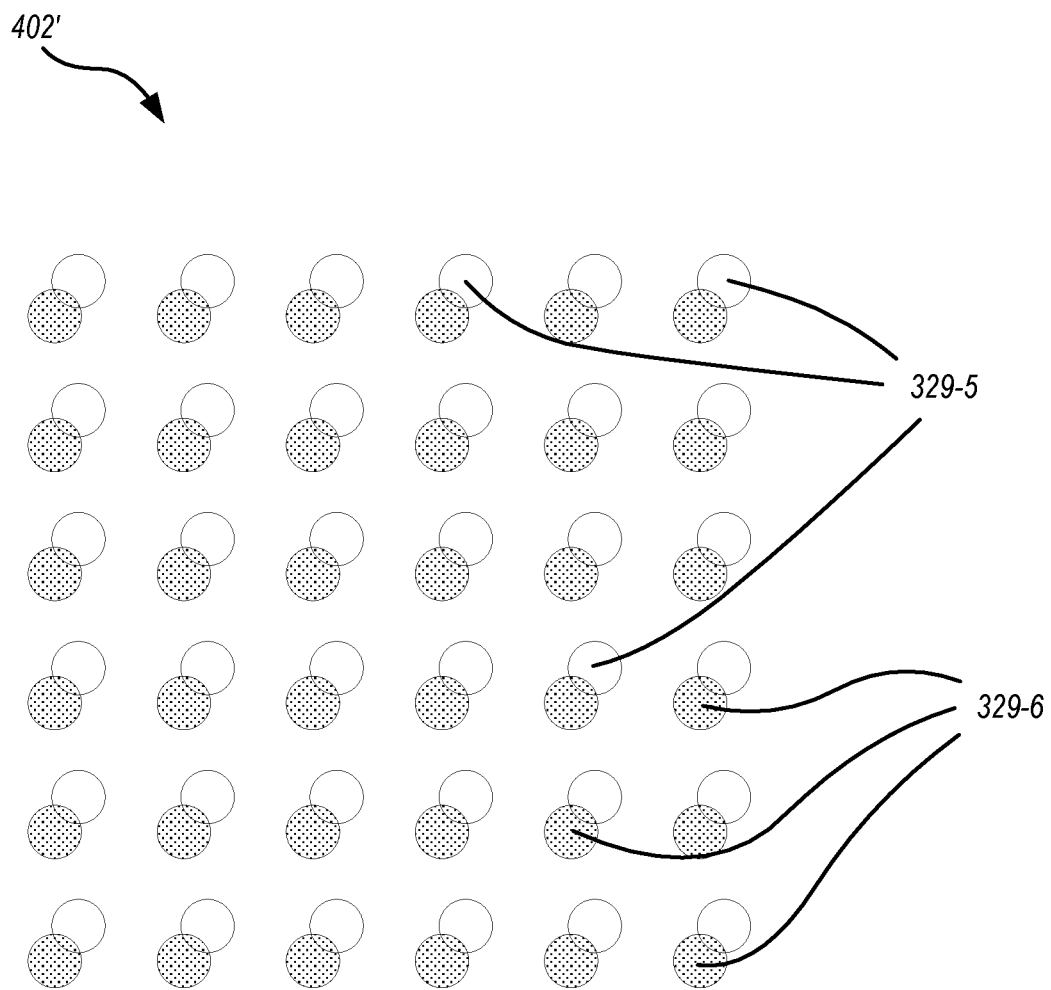
FIG. 9C schematically illustrates a layout that includes the apertures illustrated in FIGS. 9A and 9B, with one of the sets of apertures shifted, in a plan view, according to one or more embodiments.

FIG. 9C schematically illustrates layout 402' that includes apertures 329-5 laid out in the same arrangement relative to one another as in layouts 401 and 402, and apertures 329-6 laid out in the same arrangement relative to one another as in layout 402. However, in layout 402', all apertures 329-6 are shifted relative to apertures 329-5, as would occur if one electrode forming apertures 329-6 were shifted laterally relative to another electrode forming apertures 329-5 (e.g., using horizontal actuators 330-6 and 330-7, FIG. 8). In FIG. 9C, it can be seen that each aperture 329-5 overlaps a corresponding aperture 329-6 by the same amount as each other aperture 329-5 overlaps a corresponding aperture 329-6. This illustrates that when two electrodes have apertures in identical arrangements, shifting one electrode laterally relative to the other electrode can be utilized to bring apertures into alignment across an entire working area of the electrode simultaneously. Because each overlapping pair of apertures 329-5, 329-6 is at the same spacing as either of apertures 329-5 and/or 329-6, plasma products such as free electrons or ions can pass at locations that are at the same spacing as the apertures themselves. Thus, the ionized plasma products can mix uniformly by the time they reach a workpiece being processed. The ability to move one electrode relative to another, and to use a gap between the electrodes to prevent ionized plasma products from moving through except where apertures overlap, creates the ability to selectively gate the ionized plasma products, without changing plasma generation conditions and without changing out electrodes to replace small diameter apertures with larger apertures.

Other layout strategies for apertures on two electrodes are possible and certain design tradeoffs are possible. For example, each of apertures 329-5 and 329-6 in layout 402 is relatively sparse in the sense that each electrode that forms the apertures is mostly solid, with only about 14% of the surface area removed to form apertures. This may allow for fine control of aperture overlap (e.g., relatively large electrode motions required to make apertures overlap, and relatively small increase of overlap area with further motion) but may reduce overall throughput of unionized species due to the low aperture area. The same layout, but using larger apertures, would increase overall throughput of unionized species but may decrease control of aperture overlap (e.g., relatively small electrode motions required to make apertures overlap, and relatively quick increase of overlap area with further motion).

Figure 10A:
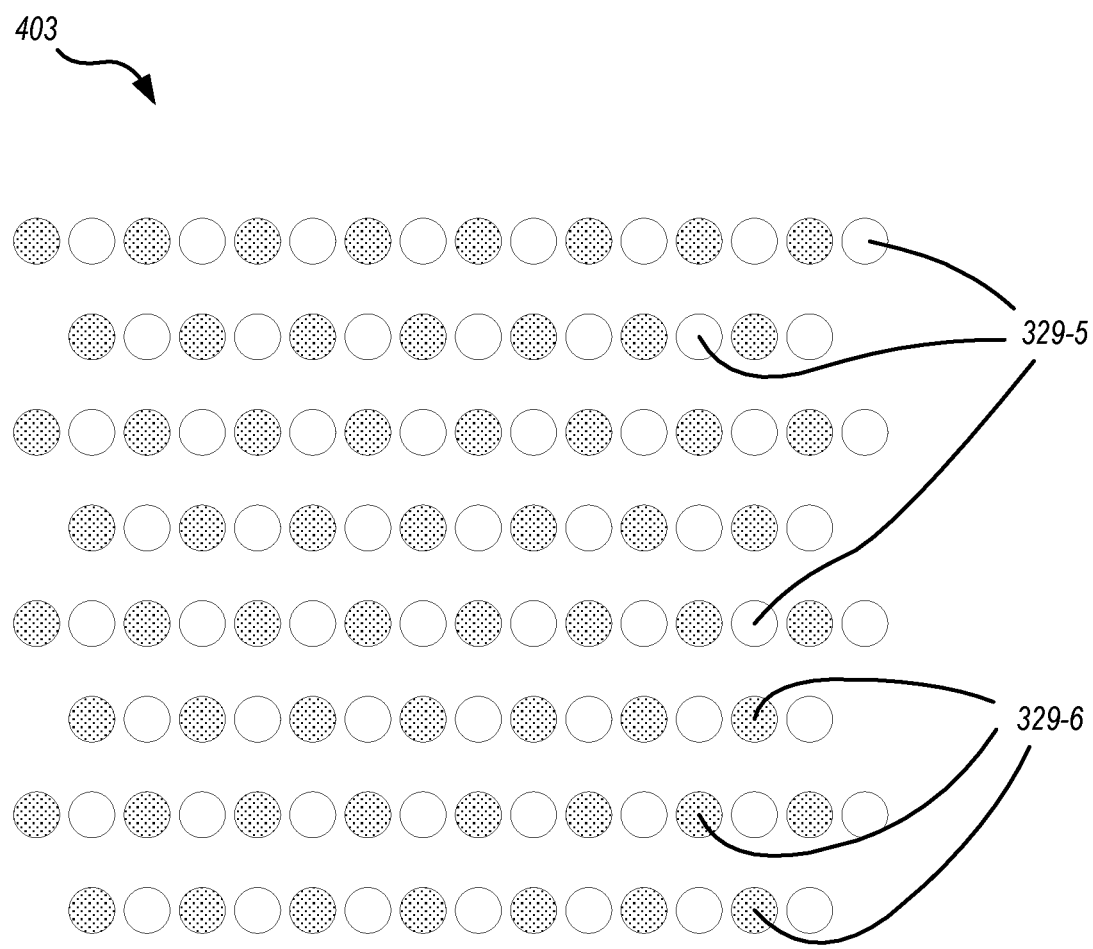
FIG. 10A schematically illustrates a layout of apertures in hexagonal arrangements that can be formed in each of an upper and a lower electrode, in a plan view, according to one or more embodiments.

FIG. 10A schematically illustrates a layout 403 of apertures 329-5, 329-6 in hexagonal arrangements that can be formed in each of an upper and a lower electrode. In layout 403, apertures 329-6 are located horizontally adjacent to apertures 329-5 in the orientation of FIG. 10A, but this need not necessarily be the case; apertures 329-6 could be formed with vertical offsets, horizontal offsets or both relative to apertures 329-5. Also, in the arrangement shown in FIG. 10A, a horizontal movement of one electrode, in the orientation of the drawing, would result in overlap between apertures 329-5 and 329-6 with a smaller movement than a vertical movement of the electrode in the orientation of the drawing.

Figure 10B:
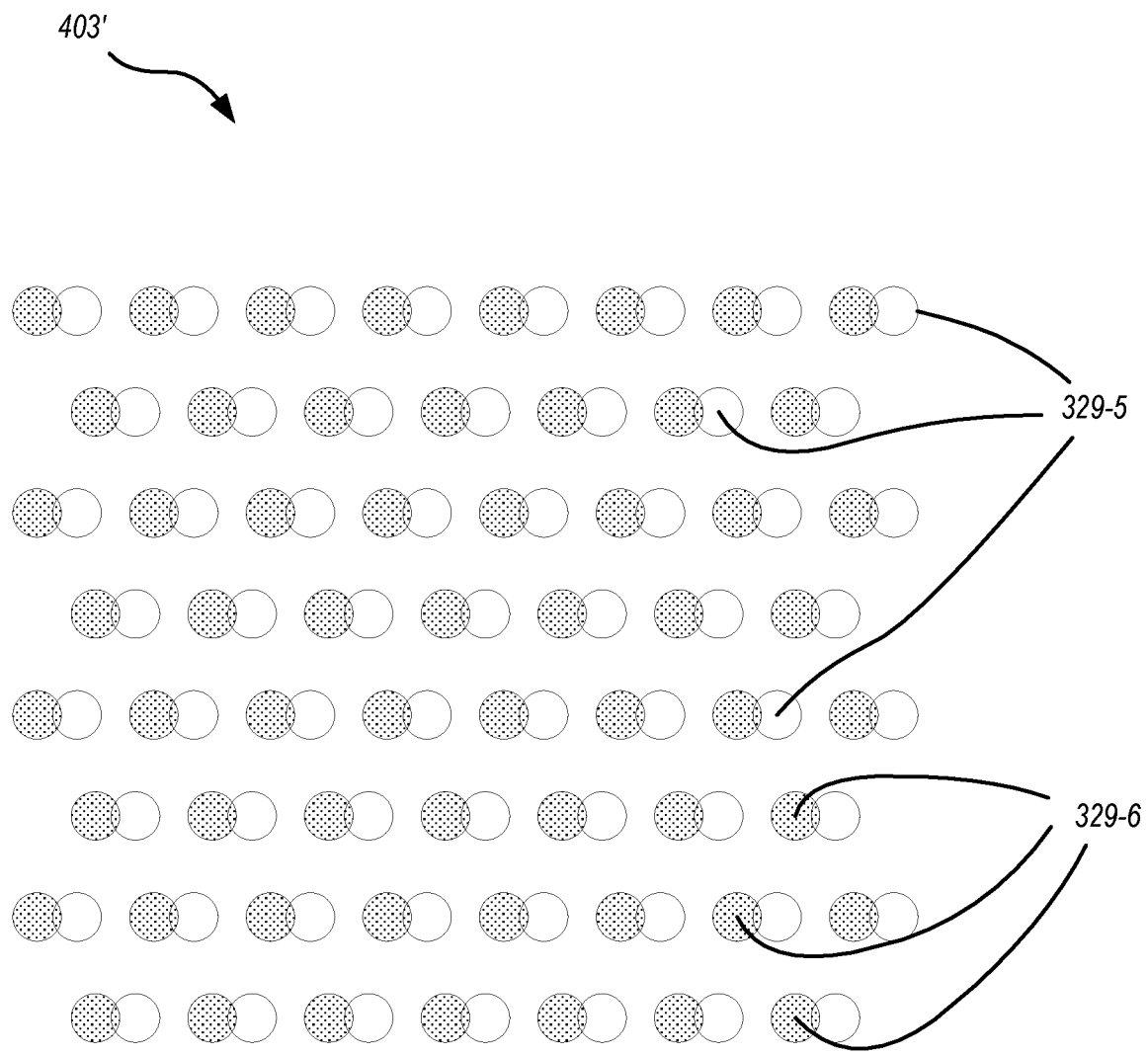
FIG. 10B schematically illustrates the a layout of apertures shown in FIG. 10A, with one of the sets of apertures shifted such that a small overlap occurs between each pair of apertures, in a plan view, according to one or more embodiments.

FIG. 10B schematically illustrates a layout 403' of apertures 329-5, 329-6 in the hexagonal arrangements shown in FIG. 10A, but shifted such that a small overlap occurs between each pair of apertures 329-5, 329-6. It can be seen that, in the orientation of FIG. 10B, if apertures 329-5 are shifted further in the horizontal direction, overlap between pairs of apertures 329-5, 329-6 will increase or decrease quickly, but if apertures 329-5 are shifted in the vertical direction, overlap between pairs of apertures 329-5, 329-6 will increase or decrease slowly. This demonstrates that, for some layouts, sensitivity of overlap area to movement can be particular to the direction of movement, which can be used to provide relatively coarse and fine processing adjustments. That is, in the orientation of FIG. 10B, horizontal movements would provide coarse adjustments (i.e., relatively large changes of overlap area with respect to motion) while, after overlap is established, vertical movements would provide fine adjustments.

Figure 11:
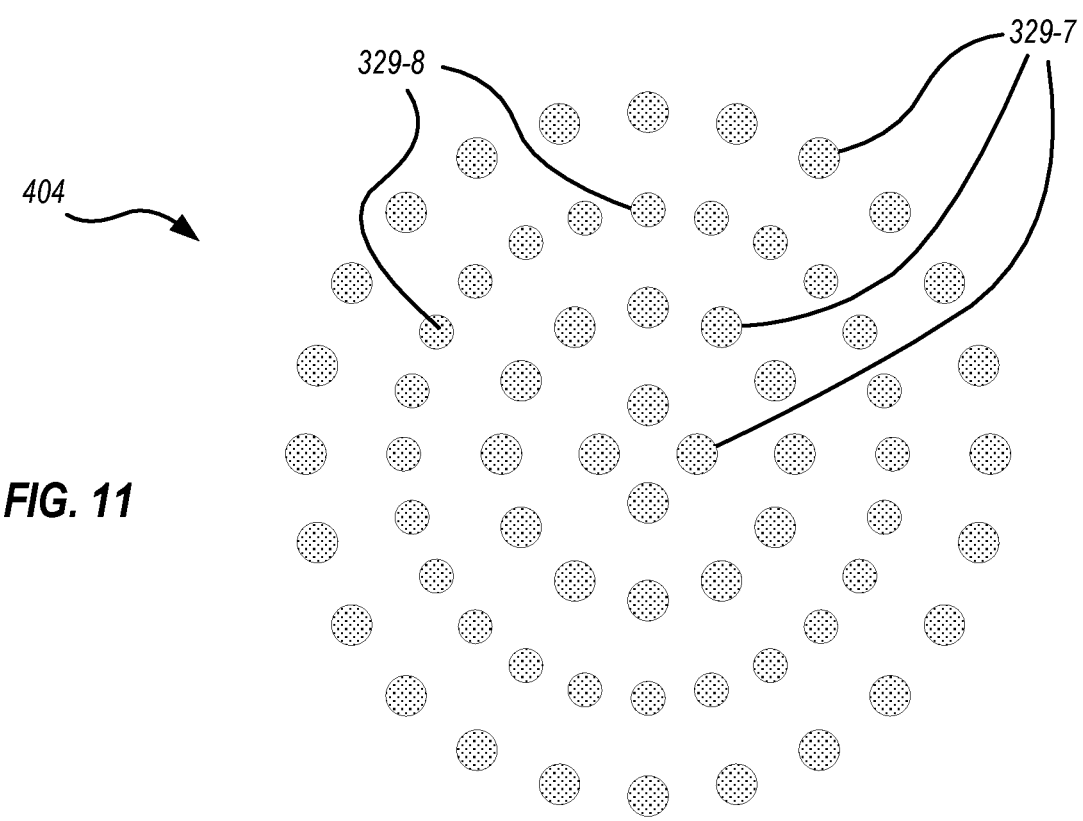
FIG. 11 schematically illustrates a layout of apertures in a radial arrangement, in a plan view, according to one or more embodiments.

FIG. 11 schematically illustrates a layout 404 of apertures 329-7, 329-8 in a radial arrangement. It can be appreciated that care may be needed in radial layouts so that a ratio of aperture area to electrode area remains uniform at different radii, and so that distances between adjacent apertures 329 allow for placement of apertures on an opposing electrode without forming unintended overlaps in an initial position of the electrodes It may be advantageous to form apertures 329 of differing sizes depending on their location within a layout; note that apertures 329-8 are illustrated as smaller than apertures 329-7.

Figure 12:
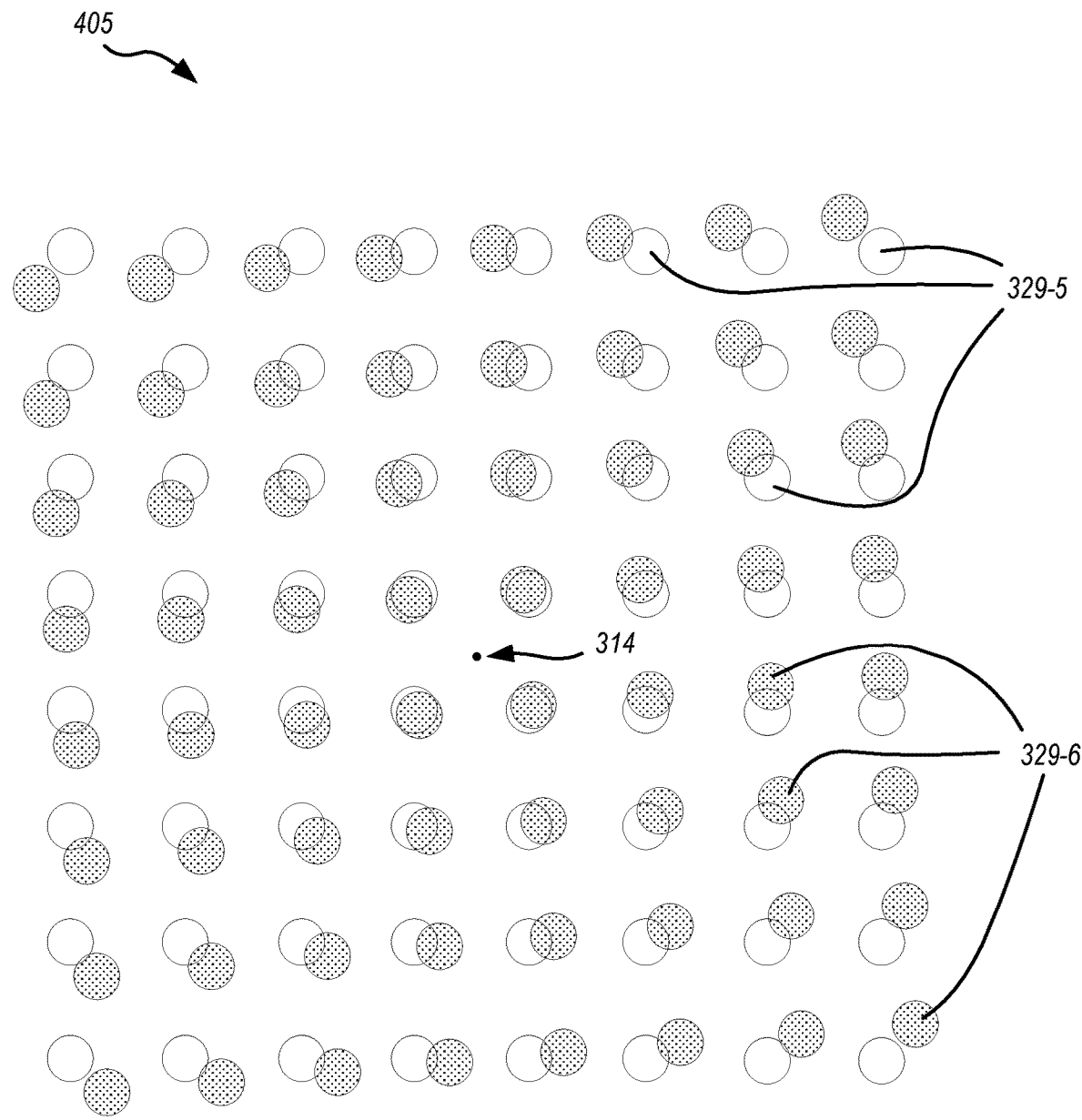
FIG. 12 schematically illustrates a layout in which one set of apertures has been rotated relative to another set of apertures, in a plan view, according to one or more embodiments.

Rotation of electrodes can have a variety of effects on aperture alignment that can depend on initial aperture layout, size, spacing, and positioning relative to axis of the rotation. For example, FIG. 12 schematically illustrates a layout 405 in which one set of apertures 329-6 has been rotated by 5 degrees relative to another set of apertures 329-5. The choice of a 5 degree rotation is for illustrative purposes only; in general, rotations used to generate overlap or non-overlap of apertures will be smaller, for reasons explained more fully below. Axis 314 is shown in layout 405, and is selected such that apertures 329-5 and 329-6 are arranged symmetrically about axis 314 in both the horizontal and vertical directions, in the orientation of FIG. 12. Because of this symmetry, similarly placed ones of apertures 329-5 and 329-6 are at about the same radii from axis 314 as one another. It can be seen that overlap among apertures 329-5 and 329-6 varies uniformly by radius from a large overlap near axis 314 to a small overlap at edges of layout 405. In corners of layout 405 where apertures 329-5 and 329-6 are furthest from axis 314, the overlap disappears entirely. It can be appreciated that larger apertures 329-5 and 329-6 might mitigate the change in amount of overlap across layout 405 as shown, that is, larger apertures at the same locations would overlap more, even out to edges of layout 405. However, it can also be appreciated that if layout 405 represents apertures formed in only part of an electrode, that beyond the apertures shown, rows and columns of apertures 329-5 will begin to overlap with apertures 329-6 in different rows and columns. This can bring about radial effects (e.g., moire patterns) such as regions where apertures overlap, then regions where apertures do not overlap, then regions where apertures overlap again, and so on, as radius from axis 314 increases.

Figure 13:
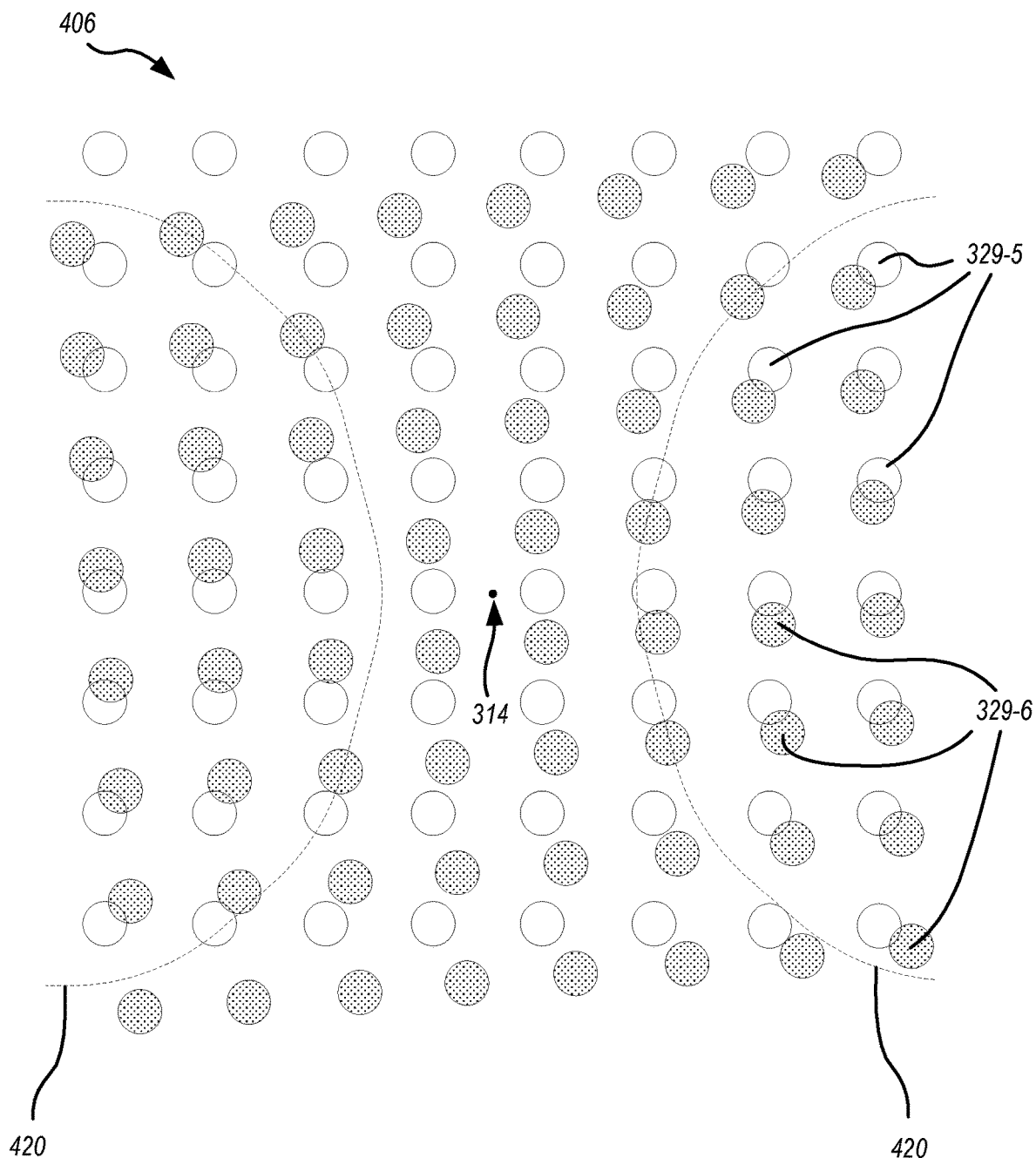
FIG. 13 schematically illustrates another layout in which one set of apertures has been rotated relative to another set of apertures, in a plan view, according to one or more embodiments.

In another example, FIG. 13 schematically illustrates a layout 406 in which, again, one set of apertures 329-6 has been rotated by 5 degrees relative to another set of apertures 329-5. Axis 314 is shown in layout 406, and this time is selected such that apertures 329-6 are arranged symmetrically about axis 314 in both the horizontal and vertical directions, in the orientation of FIG. 12; however, one row of apertures 329-5 are aligned with axis 314, but axis 314 falls between adjacent columns of apertures 329-5. Because of this arrangement, rows and columns of apertures 329-6 move from misalignment to alignment with respect to rows and columns of apertures 329-5 in a way that is not radially dependent, as in layout 405. In regions bounded by broken lines 420 on either side of layout 406, some overlap exists between apertures 329-5 and 329-6. It can be seen that if extended through large arrays of apertures 329-5 and 329-6, regions would exist where different rows and/or columns of apertures 329-5 and 329-6 would overlap. In certain embodiments, this effect can be used to generate accordingly asymmetric process effects. However, these would be unusual cases. More importantly, it can be seen that these effects tend to form an upper limit on useful values of rotation that depend on size, spacing and arrangement of apertures 329.

Figure 14:
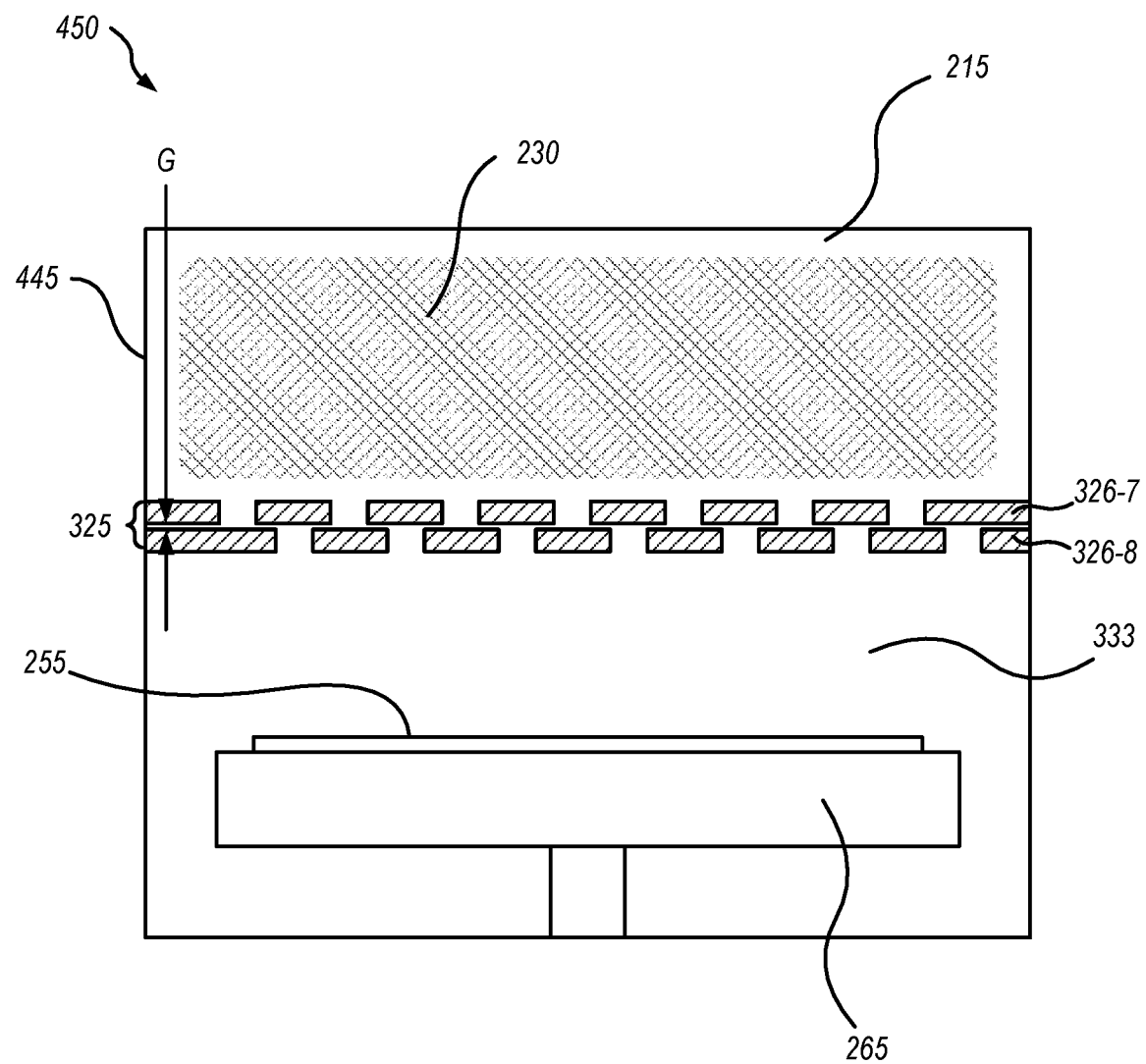
FIG. 14 is a schematic diagram illustrating major components of a plasma processing system, according to one or more embodiments.

Two piece electrode assemblies can be used to enable several new methods of providing plasma products, or operating or optimizing plasma apparatus, a few examples of which are now discussed. FIG. 14 is a schematic diagram illustrating major components of a plasma processing system 450 for reference to such components in the method descriptions that follow; additional components illustrated in other drawings herein may also be referred to in the method descriptions. System 450 includes a housing 445 to which other components of system 450 are directly or indirectly coupled. That is, housing 445 can serve as a support portion for other components of system 450, like support portion 335, FIGS. 6A, 7. System 450 includes a plasma generation region 215 that is operable to produce a plasma 230. Plasma generation region 215 may be a chamber having substantially the same width as housing 445 (e.g., like first plasma generation region 215, FIG. 2), or may be a smaller chamber or remote plasma system (e.g., like remote plasma system 201, FIG. 2). Plasma generation region 215 is in fluid communication with a downstream chamber 333 that may be a process chamber (e.g., containing pedestal 265 to support workpiece 255) or may be an intermediate chamber, with a process chamber located further downstream. Two-piece electrode assembly 325, here shown with electrodes 326-7 and 326-8, is capable of modifying the fluid communication between plasma generation region 215 and downstream chamber 333. For example, when electrodes 326-7 and 326-8 are positioned in close proximity with one another (e.g., with gap G therebetween in the range of 0.005 inch to 0.050 inch, and apertures within electrodes 326-7 and 326-8 do not overlap, electrodes 326-7 and 326-8 will keep plasma 230 (if present) within plasma generation region 215, and will prevent most free electrons and/or ions from passing through to downstream chamber 333. However, if actuators or adjustable couplers (not shown in FIG. 14, see FIGS. 6A, 7, 8) move either of electrodes 326-7 and 326-8 relative to one another so as to open up gap G, or cause apertures of electrodes 326-7 and 326-8 to align or nearly align (e.g., come within about three times the amount of gap G from alignment) then plasma, free electrons and/or ionic species may be allowed to pass from plasma generation region 215 to downstream chamber 333. Thus, if plasma products that pass from plasma generation region 215 to downstream chamber 333 are called a first portion at a first time, and are called a second portion at a second time after the relative positions of electrodes 326-7 and 326-8 change, the difference between the first position and the second position causes two piece electrode assembly 325 to modify a proportion of ionized species to neutral species in the second portion relative to the first portion.

Figure 15:
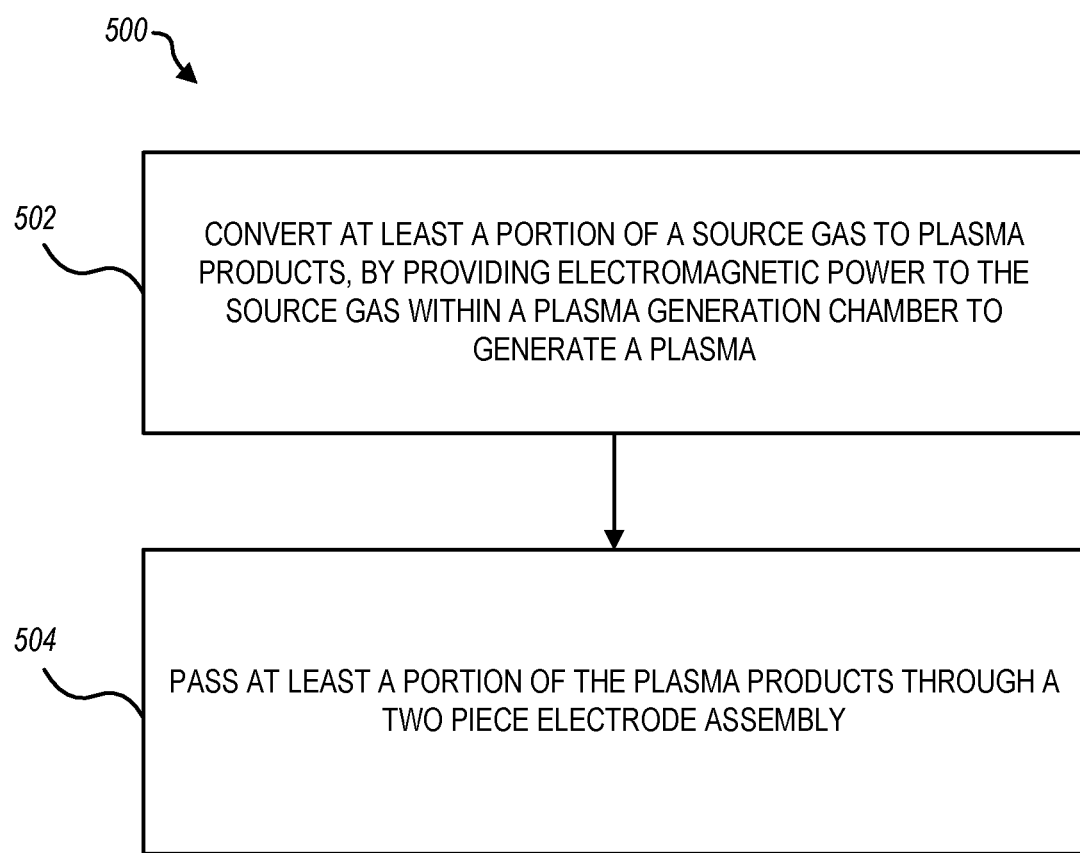
FIG. 15 is a flowchart of a method for providing plasma products, according to one or more embodiments.

FIG. 15 is a flowchart of a method 500 for providing plasma products. In a first step 502, at least a portion of a source gas is converted to plasma products, by providing electromagnetic power to the source gas within a plasma generation chamber to generate a plasma. Examples of step 505 include operating remote plasma system 201, FIG. 2, to supply plasma products through gas inlet assembly 205; generating a plasma 216 within first plasma generation chamber 215; or operating plasma system 450, FIG. 14, to generate a plasma 230 within plasma generation chamber 215. A second step 504 passes at least a portion of the plasma products through a two piece electrode assembly. The two piece electrode assembly is understood to include electrodes 326 arranged as disclosed herein. That is, a first one of the electrodes defines a plurality of first apertures therethrough, a first side of the first electrode facing the plasma such that the portion of the plasma products passes through the plurality of first apertures to a second planar side of the first planar electrode Examples of the first electrode include electrodes 326-1, FIG. 4; 326-3, FIG. 5; 326-5, FIGS. 6A, 6B and 7; and 326-7, FIG. 14. A second one of the electrodes defines a plurality of second apertures therethrough, a third planar side of the second electrode being disposed facing the second side of the first electrode. The second electrode is coupled with the first electrode such that the third planar surface is disposed adjacent to the second planar surface, with a gap distance G therebetween. The first and second apertures are arranged within the first and second electrodes such that none of the first apertures aligns with any of the second apertures to form an open straight-line path extending through both the first and second electrodes. The gap distance G is sufficient to allow neutral species of the plasma products to pass through the gap as the first portion of the plasma products, but is sufficiently small to cause ionized species of the plasma products to interact with the first or second electrodes and not to pass through the two piece electrode assembly. Examples of the second electrode include electrodes 326-2, FIG. 4; 326-4, FIG. 5; 326-6, FIGS. 6A, 6B and 7; and 326-8, FIG. 14. An example of a gap distance G that is sufficient to allow neutral species of the plasma products to pass through the gap as the first portion of the plasma products, but is sufficiently small to cause ionized species of the plasma products to interact with the first or second electrodes and not to pass through the two piece electrode assembly, is a gap distance G of 0.005 inch to 0.050 inch.

Figure 16:
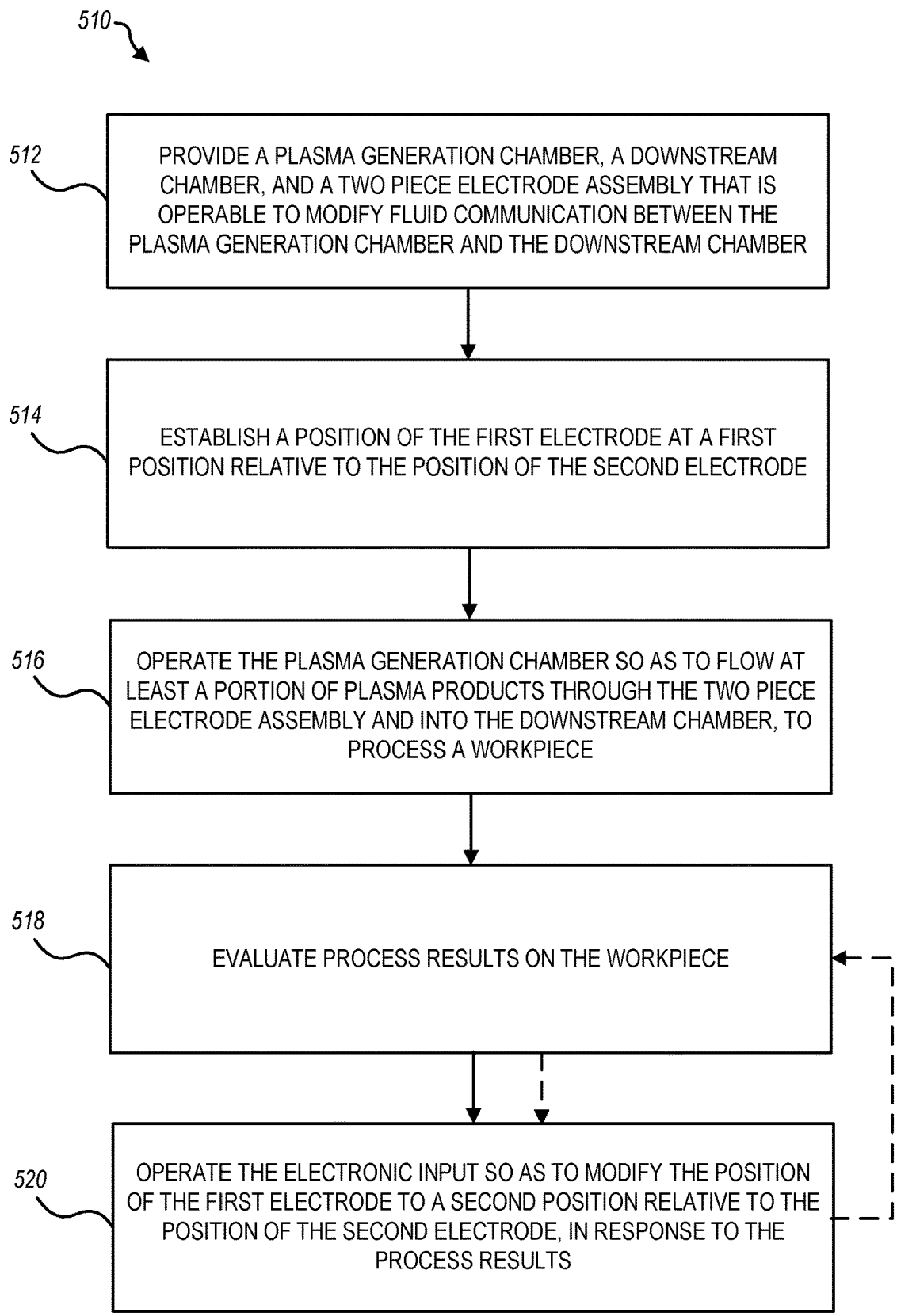
FIG. 16 is a flowchart of a method for providing plasma products, according to one or more embodiments.

FIG. 16 is a flowchart of a method 510 for optimizing a plasma apparatus. A first step 512 provides a plasma generation chamber, a downstream chamber, and a two piece electrode assembly between the plasma generation chamber and the downstream chamber. The two piece electrode assembly is operable to modify fluid communication between the plasma generation chamber and the downstream chamber. An example of step 512 is providing plasma generation chamber 215 and downstream chamber 333, with two piece electrode assembly 325 between the two, as shown in FIG. 14. The first electrode defines a plurality of first apertures therethrough. A first surface of the first electrode faces the plasma generation chamber, and a second planar surface of the first electrode faces away from the plasma generation chamber. A second electrode defines a plurality of second apertures therethrough. A third planar surface of the second electrode faces the second planar surface of the first electrode, and a fourth surface of the second electrode faces the downstream chamber. Examples of the first and second electrodes include electrodes 326-1 and 326-2, FIG. 4; 326-3 and 326-4, FIG. 5; 326-5 and 326-6, FIGS. 6A, 6B and 7; and 326-7 and 326-8, FIG. 14. One or more actuators couple the first and second electrodes. The one or more actuators are operable, in response to an electronic input, to adjust a position of the first electrode relative to a position of the second electrode. Examples of the actuators are any of actuators 330 or 330-1 through 330-8, FIGS. 6A, 7 and 8. The one or more actuators can be operated to provide at least one position of the first electrode relative to the second electrode such that the third planar surface is disposed adjacent to the second planar surface, with a first gap distance between 0.005 inch and 0.050 inch therebetween, and the first and second apertures are arranged within the first and second electrodes such that none of the first apertures aligns with any of the second apertures to form an open straight-line path extending through both the first and second electrodes. A second step 514 of method 510 establishes a position of the first electrode at a first position relative to the position of the second electrode. An example of step 514 is establishing relative positions of electrodes 326-1 and 326-2, FIG. 4; 326-3 and 326-4, FIG. 5; 326-5 and 326-6, FIGS. 6A, 6B and 7; and 326-7 and 326-8, FIG. 14. Step 514 may, for example, operate any of actuators 330 or 330-1 through 330-8, FIGS. 6A, 7 and 8 to establish the relative positions. A third step 516 of method 510 operates the plasma generation chamber so as to flow at least a portion of plasma products generated thereby, through the two piece electrode assembly and into the downstream chamber, to process a workpiece. An example of step 516 is operating plasma system 450, FIG. 14, to generate a plasma 230 within plasma generation chamber 215, flowing at least a portion of plasma products generated thereby into downstream chamber 333, and processing workpiece 255.

A fourth step 518 of method 510 evaluates process results on the workpiece. Examples of step 518 include evaluating process results on the workpiece using any known method such as, but not limited to visual inspection, optical or mechanical measurements of layers or geometries formed therein, scanning electron microscope (SEM) or atomic force microscopy (AFM) based measurements, and/or electronic measurements, such as resistivity or other characteristics of circuit elements, or actual circuits, formed in or on the workpiece. Step 518 may also include further processing steps to place the workpiece in condition for measurement, such as stripping photoresist or otherwise preparing the workpiece for measurement by a particular instrument. Step 518 may also include evaluating the process results at multiple locations on the workpiece. A further step 520 operates the electronic input so as to modify the position of the first electrode to a second position relative to the position of the second electrode, in response to the process results. Examples of step 520 include operating electronic input to any of actuators 330 or 330-1 through 330-8, FIGS. 6A, 7 and 8, to reposition either the first or the second electrode. Optionally, steps 518 and 520 may be repeated until an optimal process point, that is, an optimal relative positioning of the first and second electrodes, is found.

Method 510 thus provides a process control mechanism that takes advantage of the fact that the two piece electrode assemblies discussed herein can change process conditions at the workpiece. For example, step 518 may reveal process results that should be changed across the entire workpiece. In this case, step 520 may reposition the first and/or second electrodes to allow a larger or smaller proportion of free electrons and/or ionic species everywhere, by increasing or decreasing the gap distance G, or by moving the first and second electrodes such that alignment between apertures on the first and second electrodes is affected across an entire working area of the electrodes (e.g., as in FIGS. 9C, 10B). In a special case, step 518 may reveal process results of more than one type, such as effects of an etch on different materials such as silicon dioxide, silicon nitride, polysilicon, one or more metals, photoresist, or the like, and/or specific geometries, such as bulk etch of a layer vs. the ability to clear remnants found in corners, trenches or the like. In this special case, step 520 may be repeated, and may reposition the first and/or second electrodes, first, to optimize one type of processing (e.g., an etch step on bulk material) and, second, to optimize a different type of processing (e.g., photoresist strip or an etch step to clear remnants).

In another example, step 518 may reveal process results that should be changed to provide, or eliminate, a bias across the workpiece. In this case, step 520 may reposition the first and/or second electrodes to change parallelism of the first and second electrodes, that is, to provide gap G with a tilt or gradient across the working area, as discussed above in connection with height actuators 330-3, 330-4 and 330-5. In yet another example, step 518 may reveal process results that should be changed to provide, or eliminate, a radial effect across the workpiece. In this case, step 520 may reposition the first and/or second electrodes to increase, or decrease, radial effects by increasing, or decreasing, overlap of apertures, as discussed above in connection with FIG. 12. These changes may be made alone, or with other changes to plasma conditions (e.g., input gas flows, pressure, RF power and the like). Also, steps 518 and 520 may optionally be repeated, as shown in FIG. 16 with dashed arrows.

Figure 17:
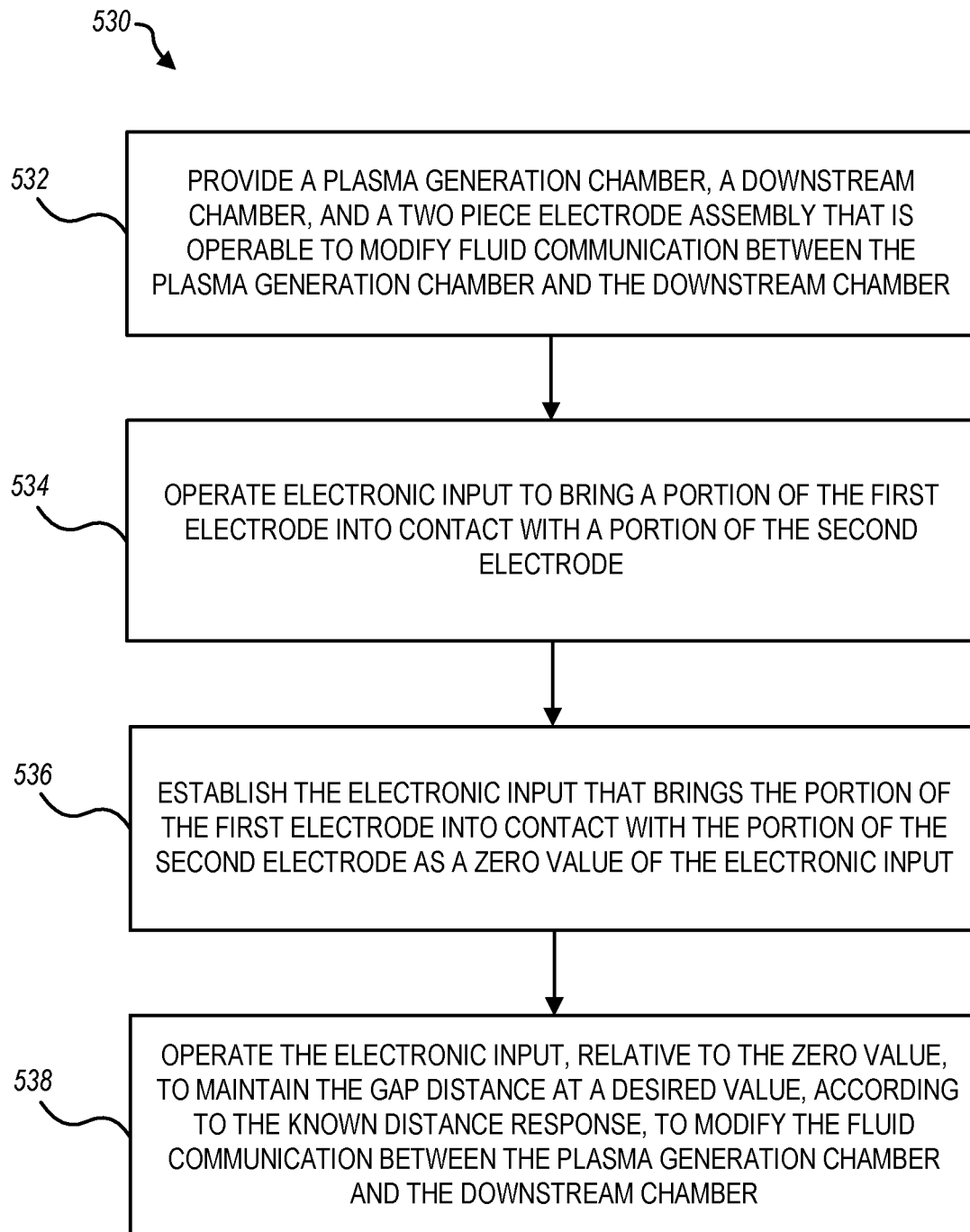
FIG. 17 is a flowchart of a method for providing plasma products, according to one or more embodiments.

FIG. 17 is a flowchart of a method 530 for optimizing a plasma apparatus. A first step 532 provides a plasma generation chamber, a downstream chamber, and a two piece electrode assembly between the plasma generation chamber and the downstream chamber. The two piece electrode assembly is operable to modify fluid communication between the plasma generation chamber and the downstream chamber. An example of step 532 is providing plasma generation chamber 215 and downstream chamber 333, with two piece electrode assembly 325 between the two, as shown in FIG. 14. The first electrode defines a plurality of first apertures therethrough. A first surface of the first electrode faces the plasma generation chamber, and a second planar surface of the first electrode faces away from the plasma generation chamber. A second electrode defines a plurality of second apertures therethrough. A third planar surface of the second electrode faces the second planar surface of the first electrode, and a fourth surface of the second electrode faces the downstream chamber. The first and second apertures are arranged within the first and second electrodes such that none of the first apertures aligns with any of the second apertures to form an open straight-line path extending through both the first and second electrodes. Examples of the first and second electrodes include electrodes 326-1 and 326-2, FIG. 4; 326-3 and 326-4, FIG. 5; 326-5 and 326-6, FIGS. 6A, 6B and 7; and 326-7 and 326-8, FIG. 14. An actuator couples the first and second electrodes. The actuator is operable, in response to an electronic input, to adjust a gap distance between the second and third planar surfaces. An example of the actuator is any of actuators 330 or 330-1 through 330-3, FIGS. 6A, 7 and 8. A second step 534 operates the electronic input so as to bring a portion of the first electrode into contact with a portion of the second electrode. An example of step 534 is operating actuator 330, FIG. 6A, to bring electrodes 326-5 and 326-6, FIGS. 6A, 6B, into contact with one another. Optionally, the contact between the first and second electrode occurs between a protrusion of one of the electrodes, and a surface of the other electrode; an example of such protrusion is region 360, FIG. 6B. Also optionally, when the portions of the first and second electrodes are in contact with one another, the gap distance away from the point of contact is less than a gap distance sufficient to allow passage or ionized species through the first apertures, the gap and the second apertures, for example 0.005 inches or less. A third step 536 establishes the electronic input to the actuator that corresponds to contact between the portions of the first and second electrodes, as a zero value of the electronic input. An example of step 536 is providing electronic input to a stepper motor acting as height actuator 330 until surface 302 is in contact with region 360, releasing the electronic input with the electrodes in contact, and reestablishing the electronic input at the position of contact. Another example of step 536 is bringing the electrodes into contact using the electronic input, and storing a value of the electronic input at the point of contact as the zero value. A further step 538 operates the electronic input, relative to the zero value, so as to maintain the gap distance at a desired value, according to the known distance response, to modify the fluid communication between the plasma generation chamber and the downstream chamber. An example of step 538 is operating the electronic input to the stepper motor acting as height actuator 330 so as to maintain gap distance G at a desired value, in accordance with a known distance response of the stepper motor.

Figure 18:
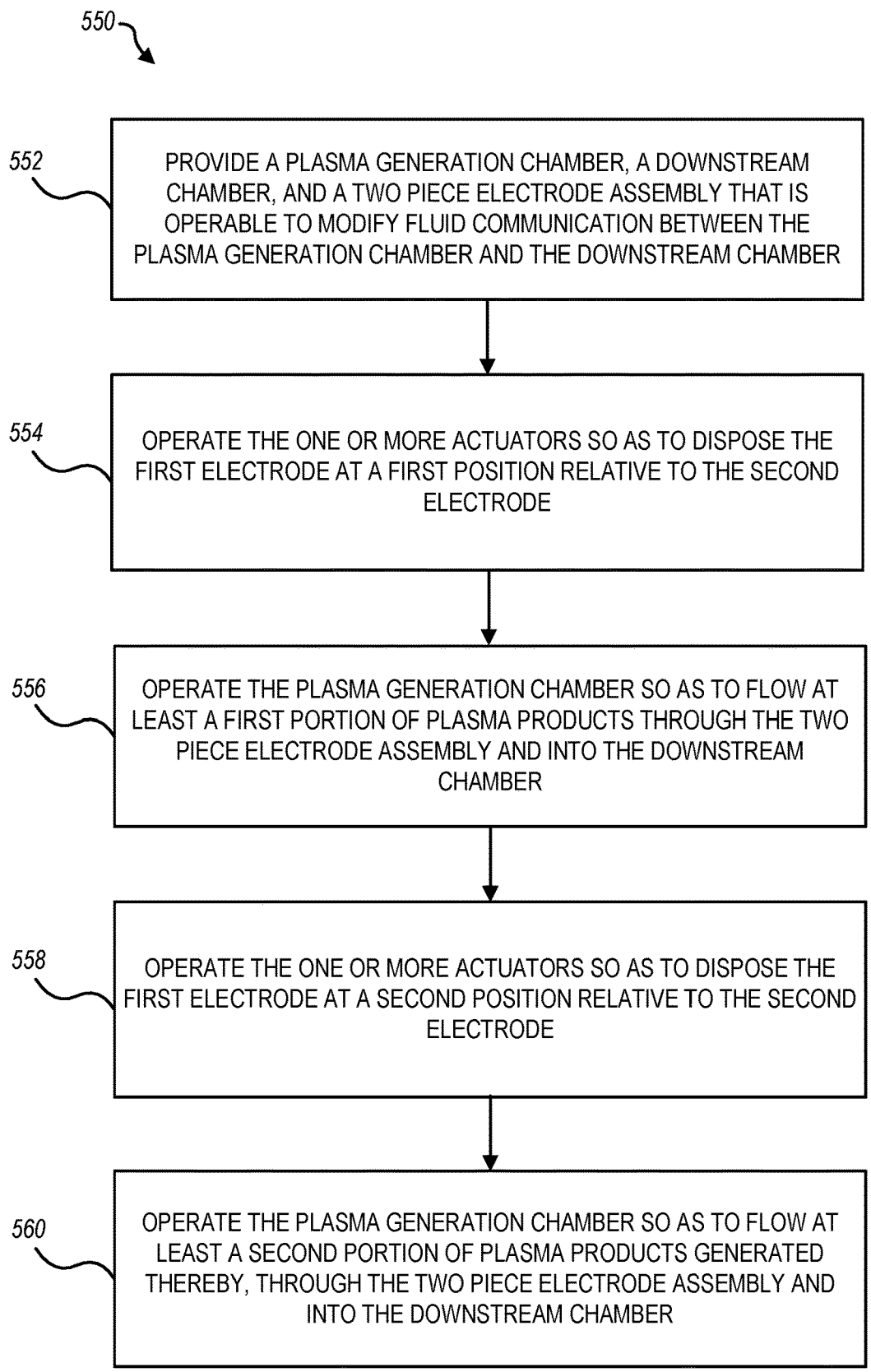
FIG. 18 is a flowchart of a method for providing plasma products, according to one or more embodiments.

FIG. 18 is a flowchart of a method 550 for optimizing a plasma apparatus. A first step 552 provides a plasma generation chamber, a downstream chamber, and a two piece electrode assembly between the plasma generation chamber and the downstream chamber. The two piece electrode assembly is operable to modify fluid communication between the plasma generation chamber and the downstream chamber. An example of step 552 is providing plasma generation chamber 215 and downstream chamber 333, with two piece electrode assembly 325 between the two, as shown in FIG. 14. The first electrode defines a plurality of first apertures therethrough. A first surface of the first electrode faces the plasma generation chamber, and a second planar surface of the first electrode faces away from the plasma generation chamber. A second electrode defines a plurality of second apertures therethrough. A third planar surface of the second electrode faces the second planar surface of the first electrode, and a fourth surface of the second electrode faces the downstream chamber. The second and third surfaces are separated by a gap distance. Examples of the first and second electrodes include electrodes 326-1 and 326-2, FIG. 4; 326-3 and 326-4, FIG. 5; 326-5 and 326-6, FIGS. 6A, 6B and 7; and 326-7 and 326-8, FIG. 14. One or more actuators couple the first and second electrodes. The actuators are operable to adjust a position of the first electrode relative to a position of the second electrode. Examples of the actuators are any of actuators 330 or 330-1 through 330-8, FIGS. 6A, 7 and 8. Each of the actuators is characterized by a range of adjustment. For at least one position within the ranges of adjustment of the one or more actuators, the first and second apertures are arranged within the first and second electrodes such that none of the first apertures aligns with any of the second apertures to form an open straight-line path extending through both the first and second electrodes, and the gap distance is between 0.0005 inch and 0.050 inch.

A second step 554 of method 550 operates the one or more actuators so as to dispose the first electrode at a first position relative to the second electrode. An example of step 554 is operating any of actuators 330 or 330-1 through 330-8, FIGS. 6A, 7 and 8 to establish relative positions of electrodes 326-1 and 326-2, FIG. 4; 326-3 and 326-4, FIG. 5; 326-5 and 326-6, FIGS. 6A, 6B and 7; and 326-7 and 326-8, FIG. 14. Step 554 is optional in the sense that the one or more actuators may or may not be operated as method 550 begins, that is, the first and second electrodes may already be in the desired first position. Optionally, also, a workpiece may be transferred into the downstream chamber, either before or after step 554, but this is not required.

A third step 556 of method 510 operates the plasma generation chamber so as to flow at least a first portion of plasma products generated thereby, through the two piece electrode assembly and into the downstream chamber. An example of step 556 is operating plasma system 450, FIG. 14, to generate a plasma 230 within plasma generation chamber 215, and flowing at least a first portion of plasma products generated thereby into downstream chamber 333. As discussed above, certain plasma products may not flow into the downstream chamber, due to the gap distance between the electrodes being sufficiently small, and/or the apertures being out of alignment, so as to keep free electrons and ions generated in the plasma from flowing through the two piece electrode assembly. Also, in step 556, a workpiece may or may not be processed. For example, step 556 may be a chamber cleaning or conditioning operation. A fourth step 558 operates the one or more actuators so as to dispose the first electrode at a second position relative to the second electrode. An example of step 558 is operating any of actuators 330 or 330-1 through 330-8, FIGS. 6A, 7 and 8 to establish relative positions of electrodes 326-1 and 326-2, FIG. 4; 326-3 and 326-4, FIG. 5; 326-5 and 326-6, FIGS. 6A, 6B and 7; and 326-7 and 326-8, FIG. 14 to move one or both of the first electrode and the second electrode. Step 558 may, for example, increase or decrease gap distance G, and may do so across an entire working area of the two piece electrode assembly, or may impart a tilt or gradient to the gap distance at various locations of the assembly. Alternatively or in addition to modifying the gap distance, step 558 may translate and/or rotate one or both of the first and second electrodes, to modify proximity or alignment of apertures therein. Step 558 may occur concurrently with step 552, that is, plasma generation may cease while the actuator(s) move the electrode(s), or plasma generation may continue. Also, optionally, a workpiece may be transferred into the downstream chamber, either before or after step 558, but this is not required.

A further step 560 operates the plasma generation chamber so as to flow at least a second portion of plasma products generated thereby, through the two piece electrode assembly and into the downstream chamber. An example of step 560 is operating plasma system 450, FIG. 14, to generate a plasma 230 within plasma generation chamber 215, and flowing at least a first portion of plasma products generated thereby into downstream chamber 333. Again, as discussed above, certain plasma products may not flow into the downstream chamber, due to the gap distance between the electrodes being sufficiently small, and/or the apertures being out of alignment, so as to keep free electrons and ions generated in the plasma from flowing through the two piece electrode assembly. Again also, in step 560, a workpiece may or may not be processed. For example, step 560 may be a chamber cleaning or conditioning operation.

Because it includes the ability to reposition one or both electrodes of a two piece electrode assembly, and such repositioning can be used to modify fluid communication between a plasma generation chamber and a downstream chamber, method 550 enables processing within a downstream chamber in ways that are believed previously unavailable in plasma systems. For example, changes in gap distance and/or aperture alignment between the two electrodes can enable a designer or engineer of a plasma process to selectively allow or restrict flow of plasma, free electrons and/or ionic species through the electrode assembly without physically changing out one electrode (e.g., a faceplate, showerhead, ion suppressor, plasma blocking screen or the like) for another.

Embodiments herein may be rearranged and may form a variety of shapes. For example, many components shown in FIGS. 2-5, 6A, 7, 8 and 14, such as gas inlet assembly 205, plasma generation chamber 215, faceplate 217, an ion suppressor 223, a showerhead 225, and a workpiece support or pedestal 265, and others may be substantially radially symmetric about a central axis, for processing a circular semiconductor wafer as workpiece 255. However, such features may be of any shape that is consistent with use as a plasma source for other workpieces. Exact numbers and placement of features for introducing and distributing gases and/or plasma products, such as diffusers, face plates and the like, may also vary. Moreover, multiple locations may be used to generate plasmas, and other components of plasma processing systems herein may be configured to add or mix gases with other gases and/or plasma products as they pass through such systems toward a downstream chamber or process chamber. As also suggested by FIGS. 2-5, 6A, 7, 8 and 14, many system components will form perforate planar shapes within central regions of a plasma processing unit so as to provide uniform process conditions across a working area 291 that is about the size of a planar workpiece 255, but the system components may also form different shapes such as flanges, thickness changes, solid imperforate surfaces, and the like at edges of the plasma processing system for structural purposes. Extent of the working area may vary, in embodiments, to accommodate different workpiece sizes, especially but not limited to, diameters of wafers as workpieces 255. When workpiece 255 is a wafer, the working area 291 will generally, but need not always, encompass a central region that extends at least to one-half of a radius of each such system component.

Specific details are given in the above description to provide a thorough understanding of the embodiments. However, it is understood that the embodiments may be practiced without these specific details. For example, well-known processes, structures, and techniques may be shown without unnecessary detail in order to avoid obscuring the embodiments. While the principles of the disclosure have been described above in connection with specific apparatuses and methods, it is to be clearly understood that this description is made only by way of example and not as limitation on the scope of the disclosure.

It is appreciated that the arrangements shown are exemplary only; other embodiments may differ greatly in configuration, including how source gases are introduced, how electrodes and insulators are arranged, how plasma and/or plasma products are handled after generation, and how grooves are formed in insulators. It is contemplated that the techniques and apparatus disclosed herein are applicable to these and other arrangements wherein conductive material builds up during use and thereby creates leakage and/or discharge paths.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. An apparatus for distributing plasma products, comprising:
    a first electrode, comprising a first planar surface and a second planar surface separated by a first electrode thickness that is between 0.125 inch and 1.000 inch, wherein the first electrode forms a plurality of first apertures extending therethrough, from the first planar surface to the second planar surface; and
    a second electrode, comprising a third planar surface and a fourth planar surface separated by a second electrode thickness that is between 0.125 inch and 1.000 inch, wherein the second electrode forms a plurality of second apertures extending therethrough, from the third planar surface to the fourth planar surface;
    wherein:
    the second electrode couples with the first electrode through one or more adjustable couplers such that the third planar surface is disposed adjacent to the second planar surface with a gap therebetween, the gap being characterized by a gap distance;
    each of the one or more adjustable couplers has a range of adjustment; and
    for at least a first position within the range of adjustment of each of the one or more adjustable couplers:
        the first and second apertures are arranged within the first and second electrodes, such that none of the first apertures aligns with any of the second apertures to form an open straight-line path extending through both the first and second electrodes; and
        the gap distance is between 0.005 inch and 0.050 inch.

2. The apparatus of claim 1, wherein the one or more adjustable couplers are adjustable using a hand tool, but are not operably coupled with actuators.

3. The apparatus of claim 1, wherein the one or more adjustable couplers are actuators that activate in response to electronic input.

4. The apparatus of claim 1, wherein the first and second electrodes and the one or more adjustable couplers are connected with one or more RF grounding straps, so that the first and second electrodes and the one or more adjustable couplers are held at a common electrical potential.

5. The apparatus of claim 1, wherein at least one of the one or more adjustable couplers is operable to adjust one or more of translation and rotation of the second planar surface with respect to the third planar surface, without substantially changing the gap distance, so that at a second position within the range of adjustment of the at least one of the one or more adjustable couplers, one or more of the first apertures is brought at least within a lateral distance of one or more of the second apertures, the lateral distance being less than three times the gap distance.

6. The apparatus of claim 5, wherein at the second position, one or more of the first apertures aligns with one or more of the second apertures so as to form an open straight-line path extending through both the first and second electrodes.

7. The apparatus of claim 1, wherein a first one of the one or more adjustable couplers is operable to adjust the gap distance.

8. The apparatus of claim 7, wherein the first one of the one or more adjustable couplers is a single adjustable coupler that is operable to adjust the gap distance but does not substantially change parallelism of the second and third planar surfaces with respect to one another.

9. The apparatus of claim 8, further comprising:
    a housing; and
    a suspension mechanism;
    and wherein:
    one of the first and second electrodes is fixedly coupled with the housing, and the other of the first and second electrodes is coupled with the suspension mechanism;
    the suspension mechanism transfers at least a portion of a weight of the other of the first and second electrodes to the housing; and
    the first one of the one or more adjustable couplers cooperates with the suspension mechanism to adjust the gap distance, while not substantially changing parallelism of the second and third planar surfaces with respect to one another.

10. The apparatus of claim 9, wherein:
    the first one of the one or more adjustable couplers comprises a stepper motor; and
    the suspension mechanism comprises a bracket coupled with one or more springs.

11. The apparatus of claim 7, wherein a second one of the one or more adjustable couplers is operable to adjust parallelism of the second and third planar surfaces with respect to one another.

12. The apparatus of claim 11, wherein:
the first one of the one or more adjustable couplers adjusts the gap distance at a first attachment point about a periphery of the second electrode, and
second and third adjustable couplers of the one or more adjustable couplers adjust the gap distance at second and third attachment points about the periphery of the second electrode so that the first, second and third adjustable couplers can apply a tilt to the second electrode, relative to the first electrode, at any azimuthal angle.

13. A plasma processing apparatus, comprising:
a plasma generator;
a processing chamber operable to receive and position a workpiece for processing; and
the apparatus of claim 1, disposed between and sealed with the plasma generator and the processing chamber, such that plasma products generated by the plasma generator must pass through the first apertures, the gap, and the second apertures, to enter the processing chamber.

14. An apparatus for distributing plasma products, comprising:
a first electrode, comprising a first planar surface and a second planar surface separated by a first electrode thickness that is between 0.100 inch and 1.000 inch, wherein the first electrode forms a plurality of first apertures extending therethrough, from the first planar surface to the second planar surface; and
a second electrode, comprising a third planar surface and a fourth planar surface separated by a second electrode thickness that is between 0.100 inch and 1.000 inch, wherein the second electrode forms a plurality of second apertures extending therethrough, from the third planar surface to the fourth planar surface;
wherein:
the second electrode is coupled fixedly with the first electrode such that the third planar surface is disposed adjacent to the second planar surface, with a gap distance of 0.005 inches to 0.050 inches therebetween; and
the first and second apertures are arranged within the first and second electrodes such that none of the first apertures aligns with any of the second apertures to form an open straight-line path extending through both the first and second electrodes.

15. The apparatus of claim 14, wherein a lateral distance from any point within one of the first apertures, to any point within any of the second apertures, is greater than three times the gap distance.

16. The apparatus of claim 14, wherein each of the first and second apertures is cylindrical and is of the same diameter, and the diameter is between 0.036 and 0.350 inches.

17. The apparatus of claim 14, wherein at least 100 of the first apertures are arranged in a rectilinear grid across the first electrode and at least 100 of the second apertures are arranged in a rectilinear grid across the second electrode.

18. The apparatus of claim 14, wherein the first and second electrodes are connected with one or more RF grounding straps, so that the first and second electrodes are held at a common electrical potential.

19. A plasma source, comprising:
a plasma generation region configured for introduction of one or more source gases therein;
an RF power supply that provides electromagnetic power to the one or more source gases to ignite a plasma within the plasma generation region;
a two piece electrode assembly that bounds the plasma generation region on one side, the two piece electrode assembly comprising:
a first electrode that defines a first planar surface and a second planar surface, wherein:
the first planar surface and the second planar surface are separated by a first electrode thickness that is between 0.100 inch and 1.000 inch, and
the first electrode forms a plurality of first apertures extending therethrough, from the first planar surface to the second planar surface; and
a second electrode that defines a third planar surface and a fourth planar surface, wherein:
the third planar surface and the fourth planar surface separated by a second electrode thickness that is between 0.100 inch and 1.000 inch,
the second electrode forms a plurality of second apertures extending therethrough, from the third planar surface to the fourth planar surface,
the second electrode is coupled with the first electrode on the one side of the plasma generation region, such that the third planar surface is disposed adjacent to the second planar surface; and
the first electrode and the second electrode are fixed or positionable with respect to one another so as to provide:
a gap between the first electrode and the second electrode, the gap forming a gap distance of 0.005 inches to 0.050 inches between the second planar surface and the third planar surface, and
a lateral separation of any point within one of the first apertures, with respect to any point within any of the second apertures, of greater than three times the gap distance; and
the plasma source further comprising a second region that is bounded on at least one side by the fourth planar surface of the second electrode, wherein the gap and the lateral separation cooperate to substantially reduce transmission of free electrons and ionized species from the plasma generation region to the second region.

20. The plasma source of claim 19, wherein the first and second electrodes are positionable with respect to one another through one or more adjustable couplers that are operable to adjust at least one of:
the gap distance; and
lateral alignment of the first and second apertures relative to one another.

* * * * *